(12) United States Patent
Cook et al.

(10) Patent No.: US 10,371,721 B2
(45) Date of Patent: Aug. 6, 2019

(54) CONFIGURATION SYSTEM FOR A POWER METER

(71) Applicant: Veris Industries, LLC, Tualatin, OR (US)

(72) Inventors: Martin Cook, Tigard, OR (US); Michael Bitsch, Hillsboro, OR (US)

(73) Assignee: Veris Industries, LLC, Tualatin, OR (US)

(*) Notice: Subject to any disclaimer, the term of this patent is extended or adjusted under 35 U.S.C. 154(b) by 326 days.

(21) Appl. No.: 15/185,758

(22) Filed: Jun. 17, 2016

(65) Prior Publication Data

US 2017/0184641 A1 Jun. 29, 2017

Related U.S. Application Data

(60) Provisional application No. 62/271,421, filed on Dec. 28, 2015.

(51) Int. Cl.
*H04Q 9/00* (2006.01)
*G01R 15/18* (2006.01)
*H04L 29/08* (2006.01)
*G01R 21/133* (2006.01)

(52) U.S. Cl.
CPC .......... *G01R 15/18* (2013.01); *G01R 21/133* (2013.01); *H04Q 9/00* (2013.01); *H04L 67/12* (2013.01); *H04Q 2209/60* (2013.01)

(58) Field of Classification Search
None
See application file for complete search history.

(56) References Cited

U.S. PATENT DOCUMENTS

| | | | |
|---|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Gotthold |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |

(Continued)

FOREIGN PATENT DOCUMENTS

EP 1531334 A2 5/2005
WO 2016176315 A1 11/2016

*Primary Examiner* — Gregory J Toatley, Jr.
*Assistant Examiner* — Brandon J Becker
(74) *Attorney, Agent, or Firm* — Chernoff, Vilhauer, McClung & Stenzel, LLP

(57) ABSTRACT

A system for configuration of power meters.

7 Claims, 26 Drawing Sheets

(56) References Cited

U.S. PATENT DOCUMENTS

| | | |
|---|---|---|
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Saft |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |

(56) References Cited

U.S. PATENT DOCUMENTS

| | | |
|---|---|---|
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,312,964 B2 | 12/2007 | Tchernobrivets |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 | 11/2008 | Westbrock, Jr. et al. |
| 7,474,088 B2 | 1/2009 | Bowman et al. |
| 7,652,871 B2 | 1/2010 | Caggiano et al. |
| 8,085,055 B2 | 12/2011 | Rupert |
| 8,160,824 B2 * | 4/2012 | Spanier ............ G01R 19/2513 702/57 |
| 8,193,803 B2 | 6/2012 | Bose et al. |
| 8,212,548 B2 | 7/2012 | Parker et al. |
| 8,212,549 B2 | 7/2012 | McNulty et al. |
| 8,294,453 B2 | 10/2012 | Bowman |
| 8,405,383 B2 | 3/2013 | Agrawal et al. |
| 8,421,443 B2 | 4/2013 | Bitsch et al. |
| 8,610,438 B1 | 12/2013 | Sykora et al. |
| 8,612,792 B2 | 12/2013 | Fu et al. |
| 8,837,118 B2 | 9/2014 | McGrail |
| 8,878,475 B2 | 11/2014 | Bonvin et al. |
| 8,964,360 B2 | 2/2015 | Trout |
| 8,988,062 B2 | 3/2015 | Sykora et al. |
| 9,146,264 B2 | 9/2015 | Cook |
| 9,329,659 B2 | 5/2016 | Cook |
| 9,395,344 B2 | 7/2016 | Sheley |
| 9,424,975 B2 | 8/2016 | Cook et al. |
| 9,577,443 B2 | 2/2017 | Gach et al. |
| 9,588,148 B2 | 3/2017 | Cook et al. |
| 9,607,749 B2 | 3/2017 | Cook et al. |
| 2001/0040446 A1 | 11/2001 | Lapinksi |
| 2004/0227503 A1 | 11/2004 | Bowman |
| 2005/0240362 A1 * | 10/2005 | Randall ................ G01R 35/04 702/61 |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed |
| 2006/0238932 A1 | 10/2006 | Westbrock |
| 2007/0153438 A1 | 7/2007 | Caggiano et al. |
| 2008/0303511 A1 | 12/2008 | Grno |
| 2008/0313006 A1 * | 12/2008 | Witter ............ G06Q 10/06311 705/7.17 |
| 2009/0115400 A1 | 5/2009 | Hunter |
| 2009/0115620 A1 | 5/2009 | Hunter |
| 2009/0295370 A1 | 6/2009 | Parker |
| 2009/0237212 A1 * | 9/2009 | Hyde .................. H04Q 9/00 340/10.1 |
| 2010/0117626 A1 | 5/2010 | Wertz et al. |
| 2010/0176960 A1 | 7/2010 | Bitsch |
| 2010/0207604 A1 | 8/2010 | Bitsch |
| 2010/0235122 A1 | 9/2010 | McCrea |
| 2010/0308792 A1 * | 12/2010 | Rupert ............... G01R 21/133 324/76.77 |
| 2011/0098985 A1 | 4/2011 | Lawson |
| 2011/0181124 A1 | 7/2011 | Uesaka |
| 2012/0004780 A1 * | 1/2012 | Miller ............ H01L 31/02021 700/286 |
| 2012/0112681 A1 | 5/2012 | Bonvin |
| 2012/0126790 A1 * | 5/2012 | Sobotka ............... G01D 4/002 324/119 |
| 2012/0217954 A1 * | 8/2012 | Cook ............... G01R 19/2513 324/123 R |
| 2012/0221278 A1 * | 8/2012 | Cook ............... G01R 21/133 702/107 |
| 2012/0235667 A1 | 9/2012 | Agrawal et al. |
| 2013/0024714 A1 | 1/2013 | Fu et al. |
| 2013/0027818 A1 | 1/2013 | McGrail |
| 2013/0144545 A1 | 6/2013 | Fu et al. |
| 2013/0201031 A1 * | 8/2013 | Yang .................. H04Q 9/00 340/870.02 |
| 2013/0294014 A1 | 11/2013 | Irons |
| 2013/0335062 A1 * | 12/2013 | de Buda ............... G01R 21/00 324/142 |
| 2014/0184198 A1 * | 7/2014 | Cook ............... G01R 21/133 324/107 |
| 2014/0239964 A1 | 8/2014 | Gach et al. |
| 2014/0340236 A1 * | 11/2014 | Rhoads ............... G08C 19/12 340/870.02 |
| 2015/0028848 A1 | 1/2015 | Lynch et al. |
| 2015/0200713 A1 * | 7/2015 | Hui .................... H04B 3/544 370/254 |
| 2015/0241490 A1 * | 8/2015 | Kitajima ............... G01R 29/18 324/76.77 |
| 2015/0276890 A1 * | 10/2015 | Turner ............... G01R 31/40 324/764.01 |
| 2015/0293549 A1 | 10/2015 | Lal et al. |

* cited by examiner

| Address | Typical Offset | Units | Description | Integer: multiplier required | Float: upper 16 bits | Float: lower 16 bits |
|---|---|---|---|---|---|---|
| 40263 | 4 | VAR | Reactive Power | | x | |
| 40264 | | VAR | Reactive Power | | | x |
| 40265 | 6 | VA | Apparent Power | | x | |
| 40266 | | VA | Apparent Power | | | x |
| 40267 | 8 | --- | Power Factor | | x | |
| 40268 | | --- | Power Factor | | | x |
| 40269 | 10 | VOLTS | Voltage, line to line | | x | |
| 40270 | | VOLTS | Voltage, line to line | | | x |
| 40271 | 12 | VOLTS | Voltage, line to neutral | | x | |
| 40272 | | VOLTS | Voltage, line to neutral | | | x |
| 40273 | 14 | AMPS | Current | | x | |
| 40274 | | AMPS | Current | | | x |
| 40275 | 16 | KW | Real Power, phase A | | x | |
| 40276 | | KW | Real Power, phase A | | | x |
| 40277 | 18 | KW | Real Power, phase B | | x | |
| 40278 | | KW | Real Power, phase B | | | x |
| 40279 | 20 | KW | Real Power, phase C | | x | |
| 40280 | | KW | Real Power, phase C | | | x |
| 40281 | 22 | --- | Power Factor, phase A | | x | |
| 40282 | | --- | Power Factor, phase A | | | x |
| 40283 | 24 | --- | Power Factor, phase B | | x | |
| 40284 | | --- | Power Factor, phase B | | | x |
| 40285 | 26 | --- | Power Factor, phase C | | x | |
| 40286 | | --- | Power Factor, phase C | | | x |
| 40287 | 28 | VOLTS | Voltage, phase A-B | | x | |
| 40288 | | VOLTS | Voltage, phase A-B | | | x |
| 40289 | 30 | VOLTS | Voltage, phase B-C | | x | |
| 40290 | | VOLTS | Voltage, phase B-C | | | x |
| 40291 | 32 | VOLTS | Voltage, phase A-C | | x | |
| 40292 | | VOLTS | Voltage, phase A-C | | | x |
| 40293 | 34 | VOLTS | Voltage, phase A-N | | x | |
| 40294 | | VOLTS | Voltage, phase A-N | | | x |
| 40295 | 36 | VOLTS | Voltage, phase B-N | | x | |
| 40296 | | VOLTS | Voltage, phase B-N | | | x |
| 40297 | 38 | VOLTS | Voltage, phase C-N | | x | |
| 40298 | | VOLTS | Voltage, phase C-N | | | x |
| 40299 | 40 | AMPS | Current, phase A | | x | |
| 40300 | | AMPS | Current, phase A | | | x |
| 40301 | 42 | AMPS | Current, phase B | | x | |
| 40302 | | AMPS | Current, phase B | | | x |
| 40303 | 44 | AMPS | Current, phase C | | x | |
| 40304 | | AMPS | Current, phase C | | | x |
| 40305 | 46 | KW | Average Real Power | | x | |
| 40306 | | KW | Average Real Power | | | x |
| 40307 | 48 | KW | Minimum Real Power | | x | |
| 40308 | | KW | Minimum Real Power | | | x |
| 40309 | 50 | KW | Maximum Real Power | | x | |
| 40310 | | KW | Maximum Real Power | | | x |

FIG. 11B

| Register | R/W | N/V | Format | Units | Scale Factor | Range | Description |
|---|---|---|---|---|---|---|---|
| 001 | R | NV | ULong | kWh | E | 0-0xFFFF | Real Energy Consumption LSW |
| 002 | R | NV | ULong | kWh | E | 0-0xFFFF | Real Energy Consumption MSW |
| 003 | R | | Uint | kW | W | 0-32767 | Total Inst. Real Power (3 Phase) |
| 004 | R | | Uint | kVA | W | 0-32767 | Total Inst. App. Power (3 Phase) |
| 005 | R | | Uint | kVAR | W | 0-32767 | Total Inst React Power (3 Phase) |
| 006 | R | | Uint | Ratio | 0.0001 | 0-10000 | Total Power Factor |
| 007 | R | | Uint | Volt | V | 0-32767 | Voltage L-L, Average 3 Phases |
| 008 | R | | Uint | Volt | V | 0-32767 | Voltage L-N, Average 3 Phases |
| 009 | R | | Uint | Amp | I | 0-32767 | Current, Average 3 Phases |
| 010 | R | | Uint | kW | W | 0-32767 | Real Power, Phase A |
| 011 | R | | Uint | kW | W | 0-32767 | Real Power, Phase B |
| 012 | R | | Uint | kW | W | 0-32767 | Real Power, Phase C |
| 013 | R | | Uint | Ratio | 0.0001 | 0-10000 | Power Factor, Phase A |
| 014 | R | | Uint | Ratio | 0.0001 | 0-10000 | Power Factor, Phase B |
| 015 | R | | Uint | Ratio | 0.0001 | 0-10000 | Power Factor, Phase C |
| 016 | R | | Uint | Volt | V | 0-32767 | Voltage, Phase A-B |
| 017 | R | | Uint | Volt | V | 0-32767 | Voltage, Phase B-C |
| 018 | R | | Uint | Volt | V | 0-32767 | Voltage, Phase A-C |
| 019 | R | | Uint | Volt | V | 0-32767 | Voltage, Phase A-N |
| 020 | R | | Uint | Volt | V | 0-32767 | Voltage, Phase B-N |
| 021 | R | | Uint | Volt | V | 0-32767 | Voltage, Phase C-N |
| 022 | R | | Uint | Amp | I | 0-32767 | Current, Inst., Phase A |
| 023 | R | | Uint | Amp | I | 0-32767 | Current, Inst., Phase B |
| 024 | R | | Uint | Amp | I | 0-32767 | Current, Inst., Phase C |
| 025 | R | | Uint | Amp | I | 0-32767 | Current, Inst., Phase Neutral |
| 026 | R | | Uint | Hz | 0.01 | 4500-6500 | Frequency (deriv. Phase A) |
| 027 | R | NV | Uint | kW | W | 0-32767 | Total Real, Power Minimum |
| 028 | R | NV | Uint | kW | W | 0-32767 | Total Real, Power Maximum |
| 029 | R | NV | ULong | kVAh | E | 0-0xFFFF | App. Energy Consum. (LSW) |
| 030 | R | NV | ULong | kVAh | E | 0-0xFFFF | App. Energy Consum. (MSW) |
| 031 | R | NV | ULong | kVARh | E | 0-0xFFFF | Reactive Energy Consum. (LSW) |
| 032 | R | NV | ULong | kVARh | E | 0-0xFFFF | Reactive Energy Consum (MSW) |
| 033 | R | | Uint | kVA | W | 0-32767 | Apparent Power, Phase A |
| 034 | R | | Uint | kVA | W | 0-32767 | Apparent Power, Phase B |
| 035 | R | | Uint | kVA | W | 0-32767 | Apparent Power, Phase C |
| 036 | R | | Uint | kVAR | W | 0-32767 | Reactive Power, Phase A |
| 037 | R | | Uint | kVAR | W | 0-32767 | Reactive Power, Phase B |
| 038 | R | | Uint | kVAR | W | 0-32767 | Reactive Power, Phase C |

FIG. 12A

| Register | R/W | N/V | Format | Units | Scale Factor | Range | Description |
|---|---|---|---|---|---|---|---|
| 039 | R | | UInt | kW | W | 0-32767 | Total Real Power Present Dmd |
| 040 | R | | UInt | kVA | W | 0-32767 | Total App. Power Pre Dmd |
| 041 | R | | UInt | kVAR | W | 0-32767 | Total Reactive Power Pre Dmd |
| 042 | R | NV | UInt | kW | W | 0-32767 | Total Real Power Max Demand |
| 043 | R | NV | UInt | kVA | W | 0-32767 | Total Apparent Power Max Dmd |
| 044 | R | NV | UInt | kVAR | W | 0-32767 | Total Reactive Power Max Dmd |
| 045 | R | NV | UInt | Hours | 1 | 0-32767 | Usage Hours |
| 046 | R | NV | UInt | Minutes | 1 | 0-59 | Usage Minutes |
| 047 | R | NV | UInt | Hours | 1 | 0-32767 | Total Hours |
| 048 | R | NV | UInt | Minutes | 1 | 0-59 | Total Minutes |
| 049 | R | NV | UInt | % | 0.01 | 0-10000 | Percent Usage |
| 050 | R | | UInt | % | 0.1 | 0-10000 | THD, Voltage A-N |
| 051 | R | | UInt | % | 0.1 | 0-10000 | THD, Voltage B-N |
| 052 | R | | UInt | % | 0.1 | 0-10000 | THD, Voltage C-N |
| 053 | R | | UInt | % | 0.1 | 0-10000 | THD, Voltage A-B |
| 054 | R | | UInt | % | 0.1 | 0-10000 | THD, Voltage B-C |
| 055 | R | | UInt | % | 0.1 | 0-10000 | THD, Voltage A-C |
| 056 | R | | UInt | % | 0.1 | 0-10000 | THD, Current, Phase A |
| 057 | R | | UInt | % | 0.1 | 0-10000 | THD, Current, Phase B |
| 058 | R | | UInt | % | 0.1 | 0-10000 | THD, Current, Phase C |
| 129 | R/W | | UInt | | | N/A | Reset |
| | | | | | | | -Write 30078 to clear all Energy Accumulators to 0 (All) |
| | | | | | | | -Write 14255 to reset all Power Min/Max to Present Values |
| | | | | | | | -Write 21212 to reset Peak Demand values present demand |
| | | | | | | | -Write 10001 to clear the Usage Timers to 0 |
| | | | | | | | -Read always returns 0 |
| 130 | R/W | NV | UInt | | | 10,11,12,30,31, 32,40,42,44 | System Type |
| 131 | R/W | NV | UInt | | | 1-32767 | CT Ratio - Primary |
| 132 | R/W | NV | UInt | | | 1 or 5A | CT Ratio - Secondary |
| 133 | R/W | NV | UInt | | | 1-32767 | PT Ratio - Primary |
| 134 | R/W | NV | UInt | | | 0,1,10,100 | PT Ratio - Scale |
| 135 | R/W | NV | UInt | | | 100,110,115,120 | PT Ratio - Secondary |
| 136 | R/W | NV | UInt | Hz | | 50 or 60 | Service Frequency |
| 137 | R/W | NV | UInt | | | 0,1 | Units:0=IEC,1=IEEE units |

Usage Hours / Usage Minutes combination timer counts the total time for which the absolute current on at least one phase is >0.1 Amp.

Total Hours/ Total Minutes is a time that counts the total time since the usage timer was reset.

Percent Usage is Usage Time / Total Time.

FIG. 12B

| Register | R/W | N/V | Format | Units | Scale Factor | Range | Description |
|---|---|---|---|---|---|---|---|
| 138 | R/W | | Sint | | -4 0.0001 | | Scale Factor I Default = -2 |
| 139 | R/W | | Sint | | -3 0.001 | | Scale Factor V Default = -1 |
| 140 | R/W | | Sint | | -2 0.01 | | Scale Factor W Default = -2 |
| 141 | R/W | | Sint | | -1 0.01 | | Scale Factor E Default = -2 |
| 142 | R | | Uint | | 0 1.0 | | Reserved, always returns 0 |
| 143 | R | | Uint | | 1 10.0 | | Reserved, always returns 0 |
| 144 | R | | Uint | | 2 100.0 | | Reserved, always returns 0 |
| 145 | R | | Uint | | 3 1000.0 | | Reserved, always returns 0 |
| 146 | R | | Uint | | 4 10000.0 | | Error Bitmap: |
| | | | | | | | Bit0: Phase A Voltage Out Range |
| | | | | | | | Bit1: Phase B Voltage Out Range |
| | | | | | | | Bit2: Phase C Voltage Out Range |
| | | | | | | | Bit3: Phase A Current Out Range |
| | | | | | | | Bit4: Phase B Current Out Range |
| | | | | | | | Bit5: Phase C Current Out Range |
| | | | | | | | Bit6: Freq. Out Range Phase A |
| | | | | | | | Bit7: Reserved |
| | | | | | | | Bit8: Phase Loss A |
| | | | | | | | Bit9: Phase Loss B |
| | | | | | | | Bit10: Phase Loss C |
| | | | | | | | Bit11-15: Reserved |
| 147 | R | NV | Uint | | | 0-32767 | Count of Energy Acc. Resets |
| 148 | R | NV | Uint | | | 0-32767 | Count of Usage Timer Resets |
| 149 | R | NV | Uint | Minutes | | 1-60 | Power Demand Block Interval |
| 150 | R | NV | Uint | | | 0-60 | See Below |
| 257/258 | R | NV | Float | kWh | | | Real Energy Consumption |
| 259/260 | R | | Float | kW | | | Total Inst. Real Power |
| 261/262 | R | | Float | kVA | | | Total Inst. Apparent Power |
| 263/264 | R | | Float | kVAR | | | Total Inst. Reactive Power |
| 265/266 | R | | Float | Ratio | | 0.0-1.0 | Total Power Factor |
| 267/268 | R | | Float | Volt | | | Voltage, L-L, Avg 3 Phases |
| 269/270 | R | | Float | Volt | | | Voltage, L-N, Avg 3 Phases |
| 271/272 | R | | Float | Amp | | | Current, Average 3 Phases |

Number of Power Demand Block Sub-Intervals – Sets the number of subintervals per Demand Block Interval (149 power is PQS (real power kW, reactive power kVAR, apparent power kVA) demand calculations). The demand calculation is set as follows:

0 = Sliding Block. Like rolling block, but with a subinterval of 15 seconds is used for Demand Intervals <= 15 minutes, or 60 seconds for intervals > 15 minutes.

1 = Block. Fixed block with no sub-intervals.

>1 = Rolling Block. The number of sub-intervals per block. This value divides evenly into the Block Demand Interval. For example, if the Demand Block Interval is 15 minutes, value subinterval values are: 3, 5, or 15. If the value of 3 is chosen, then there will be 3 subintervals of 5 minutes each.

FIG. 12C

| Register | R/W | N/V | Format | Units | Scale Factor | Range | Description |
|---|---|---|---|---|---|---|---|
| 273/274 | R | | Float | kW | | | Real Power, Phase A |
| 275/276 | R | | Float | kW | | | Real Power, Phase B |
| 277/278 | R | | Float | kW | | | Real Power, Phase C |
| 279/280 | R | | Float | Ratio | | 0.0-1.0 | Power Factor, Phase A |
| 281/282 | R | | Float | Ratio | | 0.0-1.0 | Power Factor, Phase B |
| 283/284 | R | | Float | Ratio | | 0.0-1.0 | Power Factor, Phase C |
| 285/286 | R | | Float | Volt | | | Voltage, Phase A-B |
| 287/288 | R | | Float | Volt | | | Voltage, Phase B-C |
| 289/290 | R | | Float | Volt | | | Voltage, Phase A-C |
| 291/292 | R | | Float | Volt | | | Voltage, Phase A-N |
| 293/294 | R | | Float | Volt | | | Voltage, Phase B-N |
| 295/296 | R | | Float | Volt | | | Voltage, Phase C-N |
| 297/298 | R | | Float | Amp | | | Current, Inst., Phase A |
| 299/300 | R | | Float | Amp | | | Current, Inst., Phase B |
| 301/302 | R | | Float | Amp | | | Current, Inst., Phase C |
| 303/304 | R | | Float | Amp | | | Current, Inst., Neutral |
| 305/306 | R | | Float | Hz | | 45.0-65.0 | Frequency from Phase A |
| 307/308 | R | NV | Float | kW | | | Total Real Power Minimum |
| 309/310 | R | NV | Float | kW | | | Total Real Power Maximum |
| 311/312 | R | NV | Float | kVAh | | | Apparent Energy Consumption |
| 313/314 | R | NV | Float | kVARh | | | Reactive Energy Consumption |
| 315/316 | R | | Float | kVA | | | Apparent Power, Phase A |
| 317/318 | R | | Float | kVA | | | Apparent Power, Phase B |
| 319/320 | R | | Float | kVA | | | Apparent Power, Phase C |
| 321/322 | R | | Float | kVAR | | | Reactive Power, Phase A |
| 323/324 | R | | Float | kVAR | | | Reactive Power, Phase B |
| 325/326 | R | | Float | kVAR | | | Reactive Power, Phase C |
| 327/328 | R | | Float | kW | | | Total Real Power Pres Demand |
| 329/330 | R | | Float | kVA | | | Total App Power Pres Demand |
| 331/332 | R | | Float | kVAR | | | Total React Power Pres Demand |
| 333/334 | R | NV | Float | kW | | | Total Real Power Max Demand |
| 335/336 | R | NV | Float | kVA | | | Total Appar Power Max Demand |
| 337/338 | R | NV | Float | kVAR | | | Total React Power Max Demand |
| 339/340 | R | NV | Float | Hours | | >=0.0 | Usage Hours |
| 341/342 | R | NV | Float | Minutes | | 0.0-59.0 | Usage Minutes |
| 343/344 | R | NV | Float | Hours | | >=0.0 | Total Hours |
| 345/346 | R | NV | Float | Minutes | | 0.0-59.0 | Total Minutes |
| 347/348 | R | NV | Float | % | | 0.0-100.0 | Percent Usage |
| 349/350 | R | | Float | % | | 0.0-1000.0 | THD, Voltage A-N |
| 351/352 | R | | Float | % | | 0.0-1000.0 | THD, Voltage B-N |
| 353/354 | R | | Float | % | | 0.0-1000.0 | THD, Voltage C-N |
| 355/356 | R | | Float | % | | 0.0-1000.0 | THD, Voltage A-B |
| 357/358 | R | | Float | % | | 0.0-1000.0 | THD, Voltage B-C |

FIG. 12D

| Register | R/W | N/V | Format | Units | Scale Factor | Range | Description |
|---|---|---|---|---|---|---|---|
| 359/360 | R | | Float | % | | 0.0-1000.0 | THD, Voltage A-C |
| 361/362 | R | | Float | % | | 0.0-1000.0 | THD, Current, Phase A |
| 363/364 | R | | Float | % | | 0.0-1000.0 | THD, Current, Phase B |
| 365/366 | R | | Float | % | | 0.0-1000.0 | THD, Current, Phase C |
| 7000 | R | NV | Uint | | | 0-32767 | Firmware Version Reset |
| 7001 | R | NV | Uint | | | | Firmware Version OS |
| 7002/03 | R | NV | ULong | | | | Serial Number |
| 7004 | R | NV | Uint | | | 15166 | Device ID |
| 7005 | R | NV | Uint | | | 1-247 | Modbus Address |
| 7006 | R | NV | Uint | | | 2400,4800, 9600,19200 | Baud rate |
| 7007 | R | NV | Uint | | | | Password returns 0 |
| 7008 | R | | Uint | | | | Self test returns 0 |
| 7009 | R | | Uint | | | 0,65535 | PLOS |
| 7010 | R | | Uint | | | | Reserved, always returns 0 |
| 7011 | R | | Uint | | | | Reserved, always returns 0 |
| 7012 | R | | Uint | | | | Reserved, always returns 0 |
| 7013 | R | | Uint | | | | Reserved, always returns 0 |
| 7014 | R | | Uint | | | | Reserved, always returns 0 |
| 7015 | R/W | | Uint | | | | Command |
| 7016-031 | R/W | | Uint | | | | Parameters |
| 7032 | R/W | | Uint | | | | Status |
| 7033 | R/W | | Uint | | | | Result |
| 7034 | R/W | | Uint | | | | /O Data |
| 7035-162 | R/W | | Uint | | | | Data Area |

FIG. 12E

| Address | Typical Offset | Units | Description | Integer: multiplier required | Float: upper 16 bits | Float: lower 16 bits |
|---|---|---|---|---|---|---|
| 40001 | 0 | kWh | Energy Consumption, LSW | x | | |
| 40002 | 1 | kWh | Energy Consumption, MSW | x | | |
| 40003 | 2 | kW | Real Power | x | | |
| 40004 | 3 | kVAR | Reactive Power | x | | |
| 40005 | 4 | kVA | Apparent Power | x | | |
| 40006 | 5 | --- | Power Factor | x | | |
| 40007 | 6 | Volts | Voltage, line to line | x | | |
| 40008 | 7 | Volts | Voltage, line to neutral | x | | |
| 40009 | 8 | Amps | Current | x | | |
| 40010 | 9 | kW | Real Power, Phase A | x | | |
| 40011 | 10 | kW | Real Power, Phase B | x | | |
| 40012 | 11 | kW | Real Power, Phase C | x | | |
| 40013 | 12 | --- | Power Factor, Phase A | x | | |
| 40014 | 13 | --- | Power Factor, Phase B | x | | |
| 40015 | 14 | --- | Power Factor, Phase C | x | | |
| 40016 | 15 | Volts | Voltage, Phase A-B | x | | |
| 40017 | 16 | Volts | Voltage, Phase B-C | x | | |
| 40018 | 17 | Volts | Voltage, Phase A-C | x | | |
| 40019 | 18 | Volts | Voltage, Phase A-N | x | | |
| 40020 | 19 | Volts | Voltage, Phase B-N | x | | |
| 40021 | 20 | Volts | Voltage, Phase C-N | x | | |
| 40022 | 21 | Amps | Current, Phase A | x | | |
| 40023 | 22 | Amps | Current, Phase B | x | | |
| 40024 | 23 | Amps | Current, Phase C | x | | |
| 40025 | 24 | kW | Average Real Power | x | | |
| 40026 | 25 | kW | Minimum Real Power | x | | |
| 40027 | 26 | kW | Maximum Real Power | x | | |
| 40257 | --- | kWh | Energy Consumption | | x | |
| 40258 | | kWh | Energy Consumption | | | x |
| 40259 | 0 | kWh | Energy Consumption | | x | |
| 40260 | | kWh | Energy Consumption | | | x |
| 40261 | 2 | kW | Real Power | | x | |
| 40262 | | kW | Real Power | | | x |

FIG. 13A

| Address | Typical Offset | Units | Description | Integer: multiplier required | Float: upper 16 bits | Float: lower 16 bits |
|---|---|---|---|---|---|---|
| 40263 | 4 | kVAR | Reactive Power | | x | |
| 40264 | | kVAR | Reactive Power | | | x |
| 40265 | 6 | kVA | Apparent Power | | x | |
| 40266 | | kVA | Apparent Power | | | x |
| 40267 | 8 | --- | Power Factor | | x | |
| 40268 | | --- | Power Factor | | | x |
| 40269 | 10 | VOLTS | Voltage, line to line | | x | |
| 40270 | | VOLTS | Voltage, line to line | | | x |
| 40271 | 12 | VOLTS | Voltage, line to neutral | | x | |
| 40272 | | VOLTS | Voltage, line to neutral | | | x |
| 40273 | 14 | AMPS | Current | | x | |
| 40274 | | AMPS | Current | | | x |
| 40275 | 16 | KW | Real Power, phase A | | x | |
| 40276 | | KW | Real Power, phase A | | | x |
| 40277 | 18 | KW | Real Power, phase B | | x | |
| 40278 | | KW | Real Power, phase B | | | x |
| 40279 | 20 | KW | Real Power, phase C | | x | |
| 40280 | | KW | Real Power, phase C | | | x |
| 40281 | 22 | --- | Power Factor, phase A | | x | |
| 40282 | | --- | Power Factor, phase A | | | x |
| 40283 | 24 | --- | Power Factor, phase B | | x | |
| 40284 | | --- | Power Factor, phase B | | | x |
| 40285 | 26 | --- | Power Factor, phase C | | x | |
| 40286 | | --- | Power Factor, phase C | | | x |
| 40287 | 28 | VOLTS | Voltage, phase A-B | | x | |
| 40288 | | VOLTS | Voltage, phase A-B | | | x |
| 40289 | 30 | VOLTS | Voltage, phase B-C | | x | |
| 40290 | | VOLTS | Voltage, phase B-C | | | x |
| 40291 | 32 | VOLTS | Voltage, phase A-C | | x | |
| 40292 | | VOLTS | Voltage, phase A-C | | | x |
| 40293 | 34 | VOLTS | Voltage, phase A-N | | x | |
| 40294 | | VOLTS | Voltage, phase A-N | | | x |
| 40295 | 36 | VOLTS | Voltage, phase B-N | | x | |
| 40296 | | VOLTS | Voltage, phase B-N | | | x |
| 40297 | 38 | VOLTS | Voltage, phase C-N | | x | |
| 40298 | | VOLTS | Voltage, phase C-N | | | x |
| 40299 | 40 | AMPS | Current, phase A | | x | |
| 40300 | | AMPS | Current, phase A | | | x |
| 40301 | 42 | AMPS | Current, phase B | | x | |
| 40302 | | AMPS | Current, phase B | | | x |
| 40303 | 44 | AMPS | Current, phase C | | x | |
| 40304 | | AMPS | Current, phase C | | | x |
| 40305 | 46 | kW | Average Real Power | | x | |
| 40306 | | kW | Average Real Power | | | x |
| 40307 | 48 | kW | Minimum Real Power | | x | |
| 40308 | | kW | Minimum Real Power | | | x |
| 40309 | 50 | kW | Maximum Real Power | | x | |
| 40310 | | kW | Maximum Real Power | | | x |

FIG. 13B

| Integer | Float | R/W | N/V | Description |
|---|---|---|---|---|
| 1 | 257/258 | R/W | N/V | Energy Consumption, kWh, low word, 257/258 and 259/260 same floating point value |
| 2 | 259/260 | R/W | N/V | Energy Consumption, kWh, high word, 257/258 and 259/260 same floating point value |
| 3 | 261/262 | R | | Real Power, kW |
| 4 | 263/264 | R | | Reactive Power, kVAR |
| 5 | 265/266 | R | | Apparent Power, kVA |
| 6 | 267/268 | R | | Total Power Factor |
| 7 | 269/270 | R | | Voltage, L-L, average of 3 phases |
| 8 | 271/272 | R | | Voltage, L-N, average of 3 phases |
| 9 | 273/274 | R | | Current, average of 3 phases |
| 10 | 275/276 | R | | Frequency |
| 11 | 277/278 | R | | Real Power, Phase A |
| 12 | 279/280 | R | | Real Power, Phase B |
| 13 | 281/282 | R | | Real Power, Phase C |
| 14 | 283/284 | R | | Total Power Factor, Phase A |
| 15 | 285/286 | R | | Total Power Factor, Phase B |
| 16 | 287/288 | R | | Total Power Factor, Phase C |
| 17 | 289/290 | R | | Voltage, Phase A-B |
| 18 | 291/292 | R | | Voltage, Phase B-C |
| 19 | 293/294 | R | | Voltage, Phase A-C |
| 20 | 295/296 | R | | Voltage, Phase A-N |
| 21 | 297/298 | R | | Voltage, Phase B-N |
| 22 | 299/300 | R | | Voltage, Phase C-N |
| 23 | 301/302 | R | | Current, Phase A |
| 24 | 303/304 | R | | Current, Phase B |
| 25 | 305/306 | R | | Current, Phase C |
| 26 | 307/308 | R | | Current Neutral |
| 27 | 309/310 | R/W | | Average kW |
| 28 | 311/312 | R/W | | Minimum kW |
| 29 | 313/314 | R/W | | Maximum kW |
| 30 | | R/W | N/V | CT Scale |
| 31 | | R/W | N/V | Over Voltage Alarm Threshold |
| 32 | | R/W | N/V | Under Voltage Alarm Threshold |
| 33 | | R/W | N/V | Over Current Alarm Threshold |
| 34 | | R/W | N/V | Under Current Alarm Threshold |
| 35 | | R/W | N/V | Over kVA Alarm Threshold |

FIG. 14A

| Integer | Float | R/W | N/V | Description |
|---|---|---|---|---|
| 36 | | R/W | N/V | Under kVA Alarm Threshold |
| 37 | | R/W | N/V | Meter Alarm Status: holds the state of the meter alarm latches |
| | | | | bit0 = over current; bit1 = under current; bit2 = over kVA; bit3 = under kVA; |
| | | | | bit4 = over voltage; bit5 = under voltage; bit6 = phase loss A; bit7 = phase loss B |
| | | | | bit8 = phase loss C; bits 9-15 = 0 |
| 38 | | R/W | N/V | Phase Loss Threshold; independent for each of the 3 phases |
| | | | | A phase loss occurs only if: |
| | | | | 1 Average L-L voltage (register 8) is greater than 25 volts |
| | | | | 2 L-N voltage on a phase (register 20, 21, or 22) is less than a percent deviation |
| | | | | 3 The threshold is set between 0 and 100% |
| 39 | | R/W | N/V | Meter Name, first two characters |
| 40 | | R/W | N/V | Meter Name, second 2 characters |
| 41 | | R/W-G | N/V | Board Name, first 2 characters |
| 42 | | R/W-G | N/V | Board Name, second 2 characters |
| 43 | | R-G | N/V | Firmware Revision -- Reset System |
| 44 | | R-G | N/V | Firmware Revision -- Operating System |
| 45 | | R-G | N/V | Serial number MSW |
| 46 | | R-G | N/V | Serial number LSW |
| 47 | | R-G | | Error Register |
| 48 | | R-G | N/V | Device ID |
| 49 | | R-G | N/V | Meter Alarm Status, see Integer 37 |
| 50 | | R | N/V | Over Voltage Set Counter |

FIG. 14B

| Integer | Float | R/W | N/V | Description |
|---|---|---|---|---|
| 51 | | R | N/V | Over Voltage Reset Counter |
| 52 | | R | N/V | Under Voltage Set Counter |
| 53 | | R | N/V | Under Voltage Reset Counter |
| 54 | | R | N/V | Phase Loss A Set Counter |
| 55 | | R | N/V | Phase Loss A Reset Counter |
| 56 | | R | N/V | Phase Loss B Set Counter |
| 57 | | R | N/V | Phase Loss B Reset Counter |
| 58 | | R | N/V | Phase Loss C Set Counter |
| 59 | | R | N/V | Phase Loss C Reset Counter |
| 60 | | R | N/V | Over Current Set Counter |
| 61 | | R | N/V | Over Current Reset Counter |
| 62 | | R | N/V | Under Current Set Counter |
| 63 | | R | N/V | Under Current Reset Counter |
| 64 | | R | N/V | Over kVA Set Counter |
| 65 | | R | N/V | Over kVA Reset Counter |
| 66 | | R | N/V | Under kVA Set Counter |
| 67 | | R | N/V | Under kVA Reset Counter |
| 68 | | R-G | N/V | Modbus Address |
| 69 | | R-G | N/V | Reserved |
| 70 | | R-G | N/V | Reserved |
| 71 | | R-G | N/V | Baud Rate |
| 72 | | R-G | N/V | Reserved |
| 73 | | R/W | N/V | Meter Enable Reigster |
| 74 | | R/W | N/V | Critical Alarm Register |

FIG. 14C

CONFIGURATION SYSTEM FOR A POWER METER

CROSS-REFERENCE TO RELATED APPLICATIONS

This application claims the benefit of U.S. Provisional App. No. 62/271,421, filed Dec. 28, 2015.

BACKGROUND OF THE INVENTION

The present invention relates to a configuration system for a power meter.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more micropro-cessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While such power metering devices tend to be effective at providing useful measurements, they often tend to require lengthy and complicated configuration.

What is desired, therefore, is a power metering system that is readily configurable.

BRIEF DESCRIPTION OF THE DRAWINGS

FIGS. 11A-B illustrate a Modbus point map.

FIGS. 12A-E illustrate another Modbus point map.

FIGS. 13A-B illustrate another Modbus point map.

FIGS. 14A-C illustrate another Modbus point map.

DETAILED DESCRIPTION OF PREFERRED EMBODIMENTS

Figure 1:
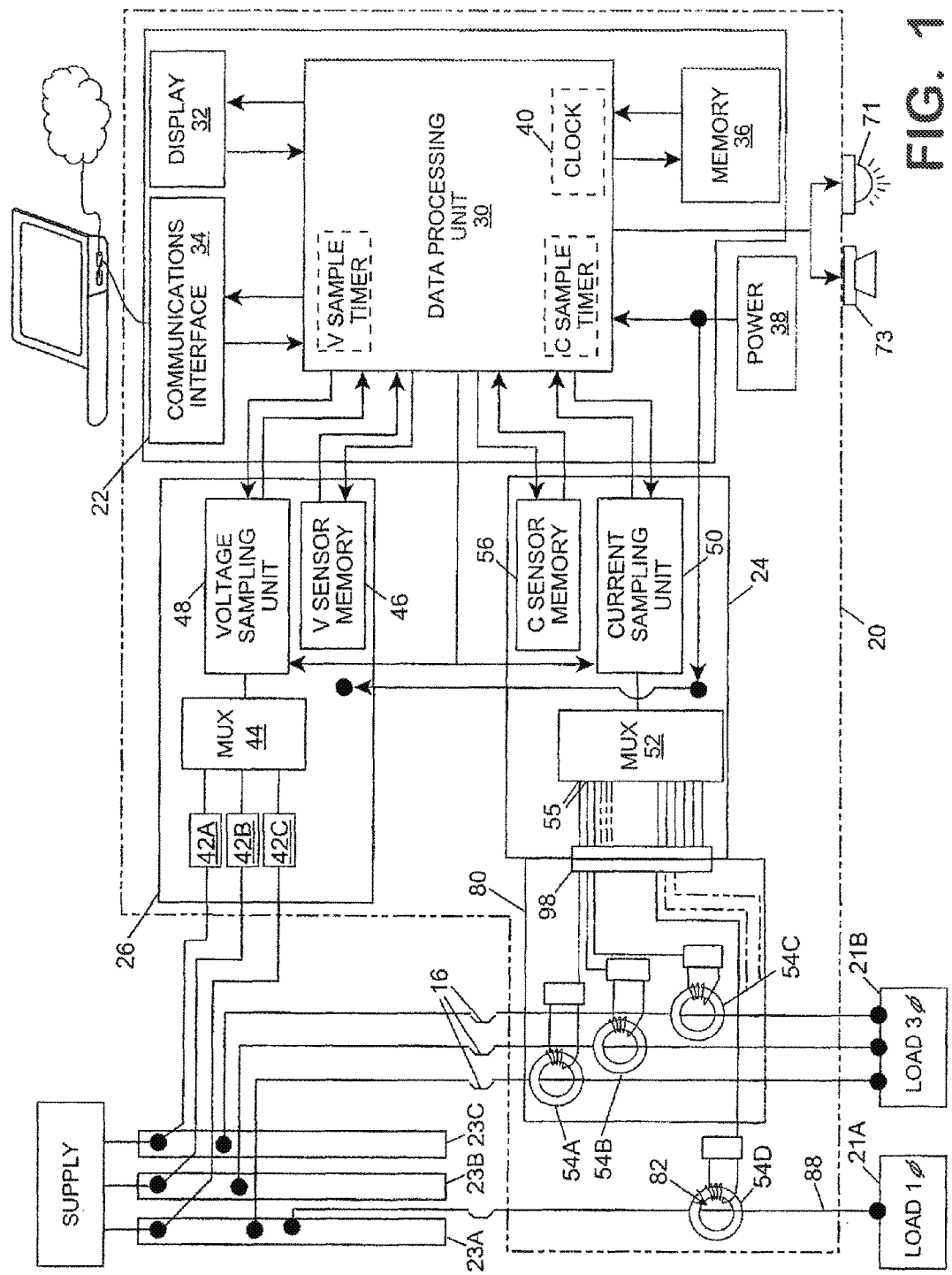
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
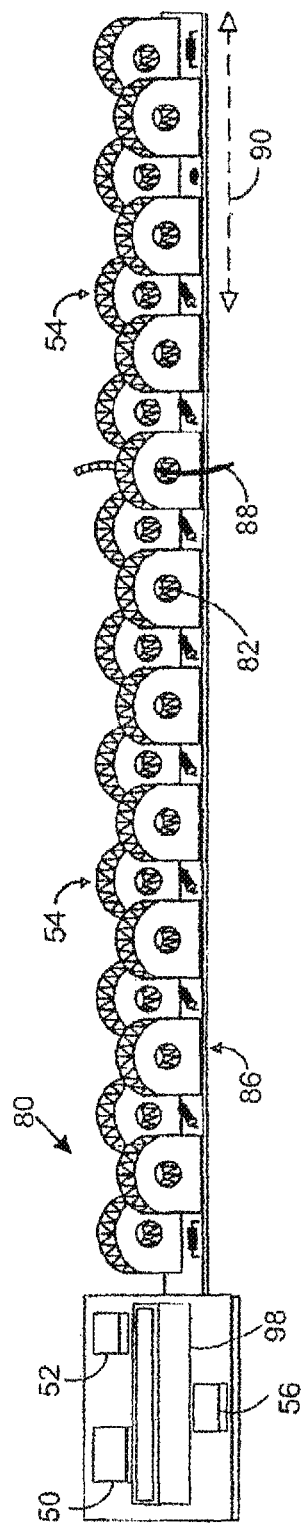
FIG. 2 is a perspective view of a current transformer strip for a branch current monitor.
Figure 3:
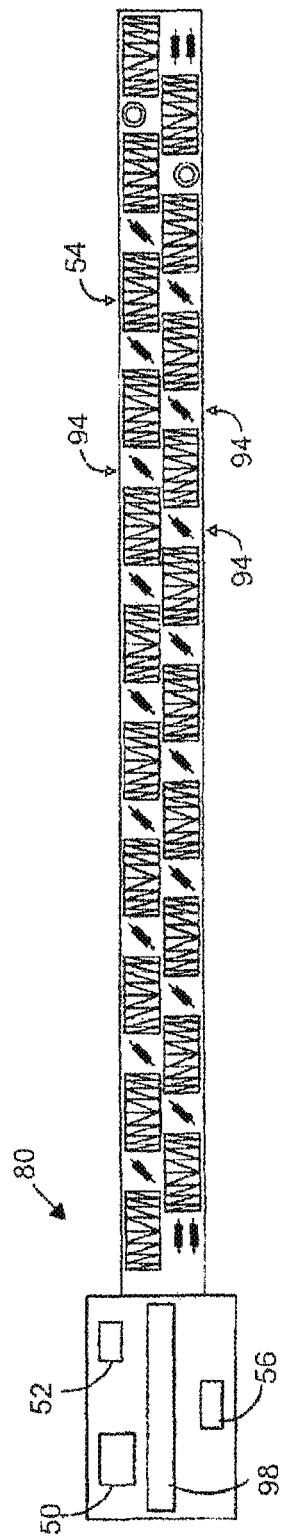
FIG. 3 is a top view of the current transformer strip of FIG. 2.
Figure 4:
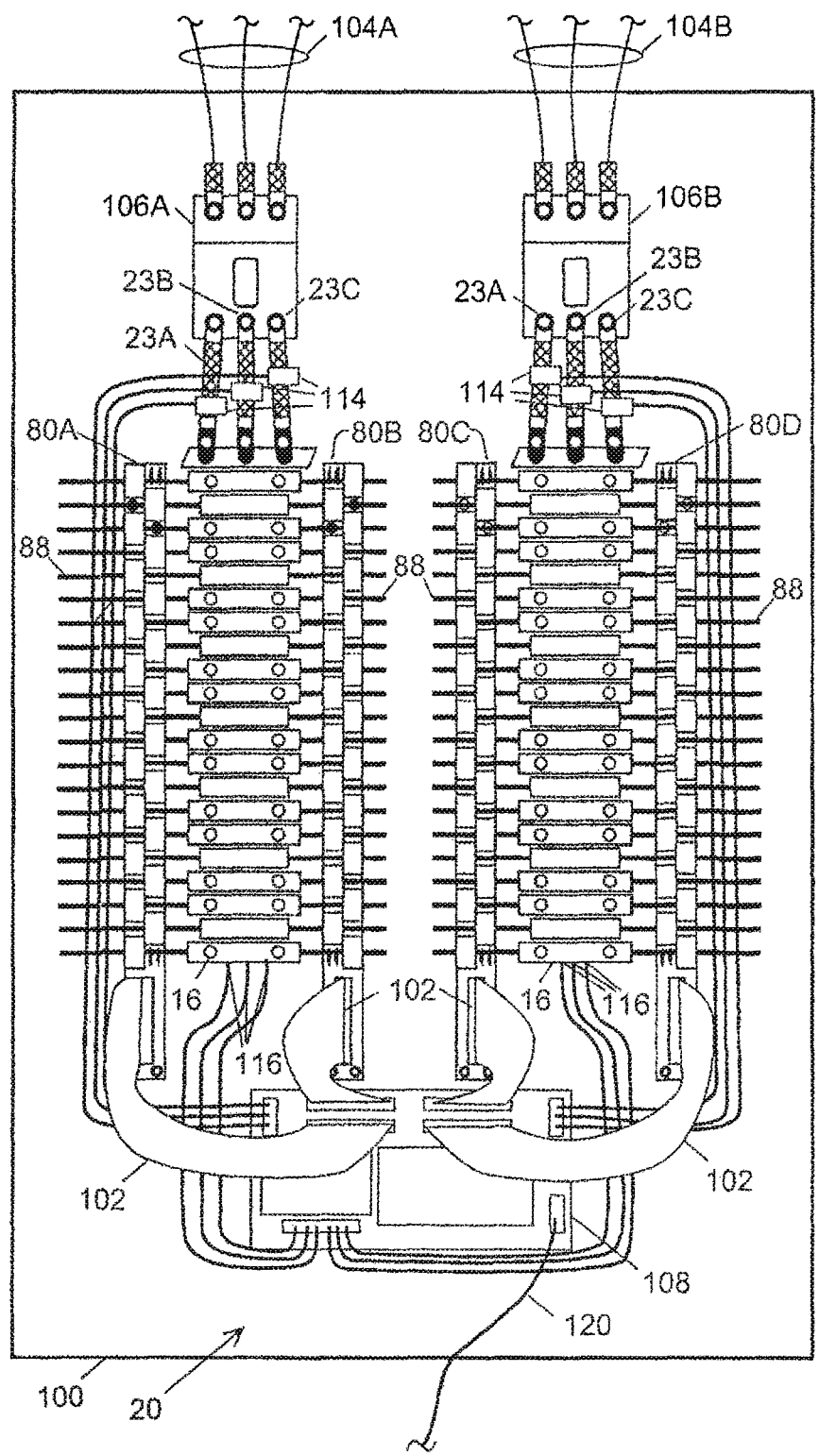
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
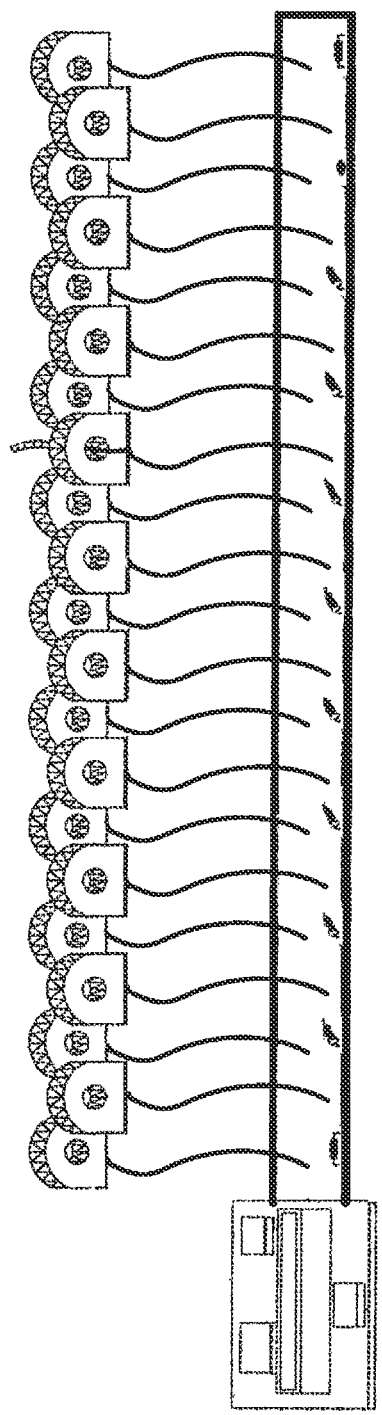
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
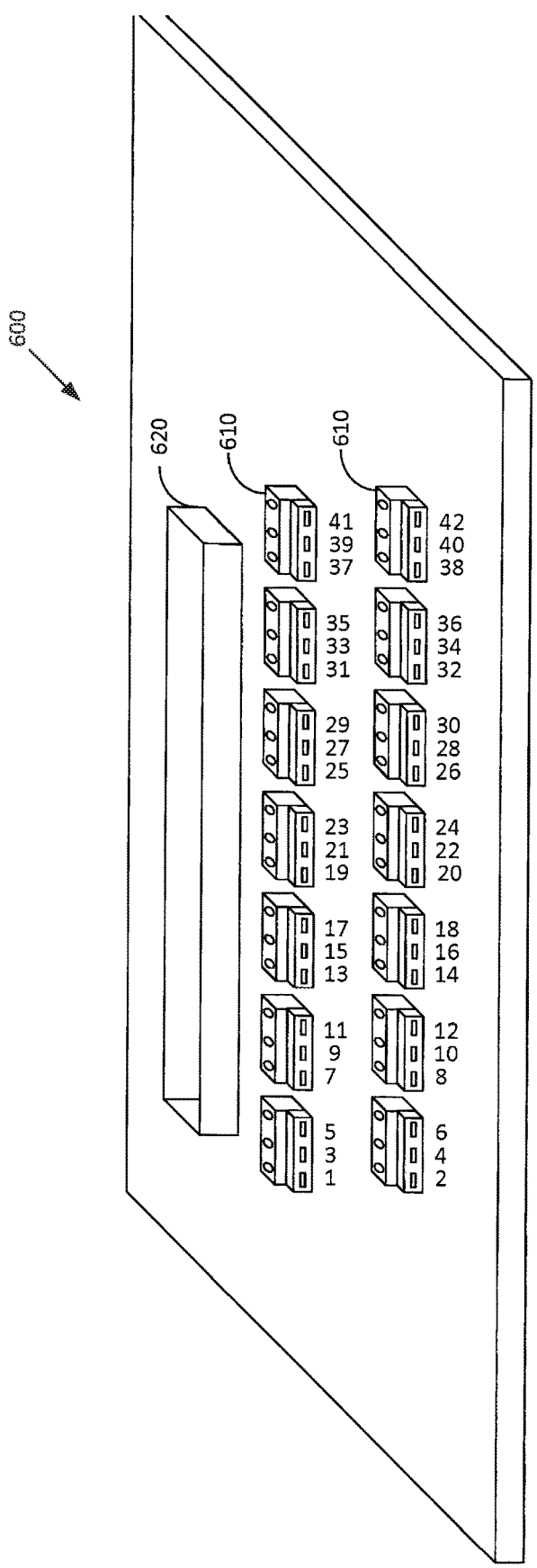
FIG. 6 illustrates a view of a connector board for a branch current monitor.

Referring to FIG. 6, another embodiment includes a set of one or more connector boards 600 in addition to or as an alternative to the strip units. Each of the connector boards may include a set of connectors 610 that may be used to interconnect a current transformer thereto. Each of the connector boards may include a connector 620 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 7:
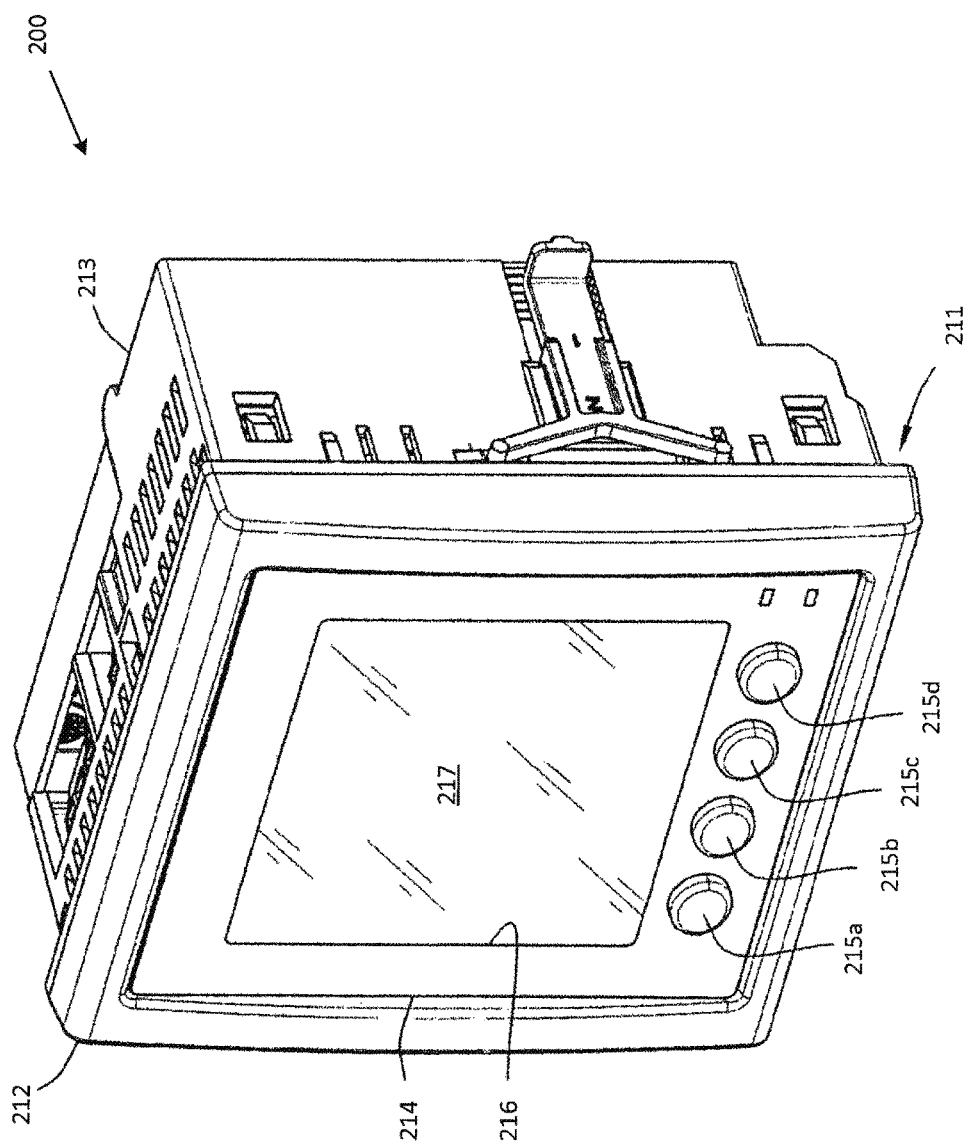
FIG. 7 illustrates an exemplary embodiment of a power meter.
Figure 8:
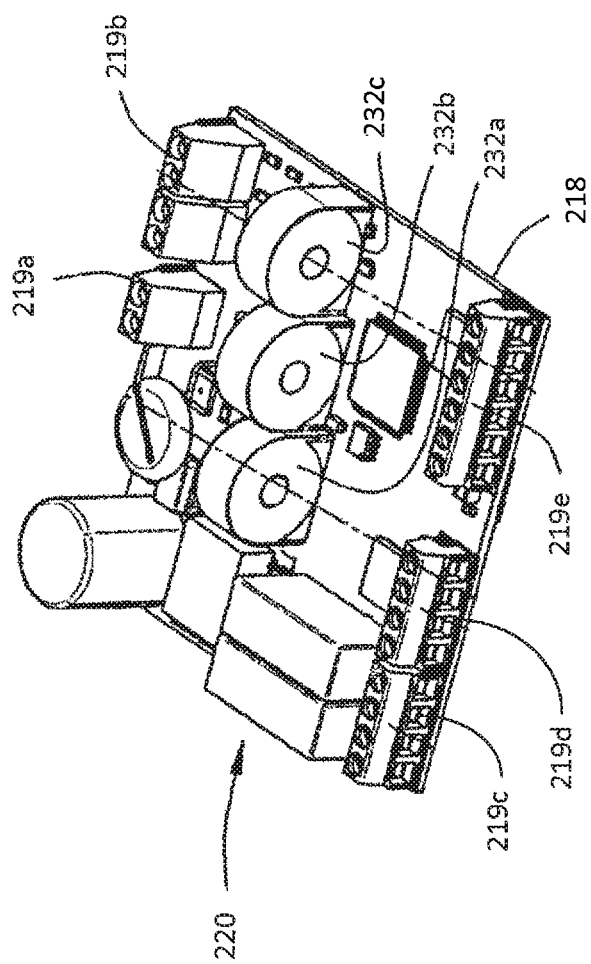
FIG. 8 illustrates a circuit board included within the power meter of FIG. 7.

Referring to FIG. 7, another embodiment of a power meter 200 is housed in a housing 211 formed by a front bezel 212 and a back cover 213 that snap together. The front bezel 212 may be bonded to a user-interface panel 214 that contains four manually operable pushbuttons 215a-215d and a central window 216 for viewing a display 217, such as an LCD, attached to the bezel 212. Behind the display 217 is a printed circuit board 218 (see FIG. 8) that has multiple terminal blocks 219a-219e and associated circuitry 220 mounted on one or both sides of the board 218. The terminal blocks 219a and 219b are used to connect the circuitry 220 to a control power supply and voltage input lines, respectively. For example, the voltage lines may be from the power panel or from the wire to the load(s). In addition the same voltage lines, for example from the power panel or the wire to the load, may further be extended to pass through a respective current transformer to sense the current therein. Also, a respective current sensor of a set of one or more current transformers may encircle a respective wire to a load, where the wires from the respective current transformer being interconnected to suitable terminals of one or more of the terminal blocks. In this manner, the power meter is capable of sensing or otherwise receiving signals representative of the voltage and current in the wires to the load(s). Terminal block 219c may be used to connect digital outputs of the circuitry 220, such as demand sync signals, alarm signals or external control signals, to relays, motors, meters or other devices. Terminal block 129d may be an RS485 port used for communicating with a monitoring and control system and can be daisy chained to multiple devices. Terminal block 219e may be used to receive digital inputs for determining circuit breaker status, counting pulses, counting motor starts, accepting demand sync pulses, and/or input metering. The terminal blocks 219a-219e and the circuitry 220 (simplified for purposes of illustration) may be used to monitor either a single-phase, a two-phase, and/or a three-phase electrical power distribution system. Typically the meter is used to measure currents and voltages and report in real time their root-mean-square values, which includes values for all three phases and neutral in the case of a three-phase power distribution system. The meter also typically calculates power factor, real power, reactive power and other electrical parameters. In some embodiments, the housing 211 includes one or more connectors suitable to detachably connect a separate power meter to sense electrical properties of the current and/or voltage being sensed.

Figure 9:
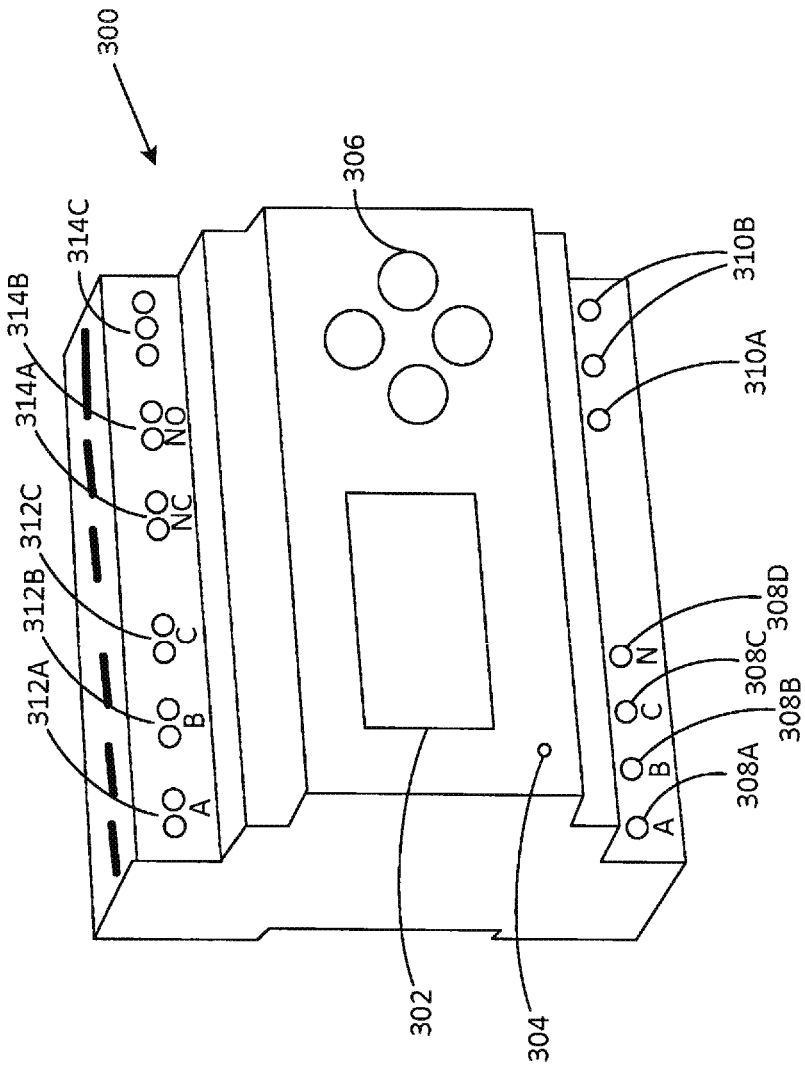
FIG. 9 illustrates another exemplary embodiment of a power meter.

Referring to FIG. 9, another embodiment of a power meter 300 housed within a housing suitable to be mounted to a standard 35 mm DIN rail or screw-mounted to the interior surface of an enclosure. The power meter 300 may include an alphanumeric display 302 to display information, such as power usage and the type thereof. The power meter 300 may include an alarm light 304 when an alarm condition occurs. The power meter 300 may include a set of configuration buttons 306. The power meter may include a set of voltage inputs, such as voltage A 308A, voltage B 308B, voltage C 308C, and voltage neutral 308D. The power meter 300 may also include an earth ground 310A and control power 310B. The power meter 300 may sense the current by using current transformers that are respectively interconnected to current sensor input phase A 312A, current sensor input phase B 312B, and/or current sensor input phase C 312C. The power meter 300 may have a set of outputs, such as a normally closed phase loss alarm 314A, a normally open pulse output representative of energy usage 314B, and other outputs 314C. In some embodiments, the power meter 300 includes one or more connectors suitable to detachably connect a separate power meter to sense electrical properties of the current and/or voltage being sensed.

Figure 10:
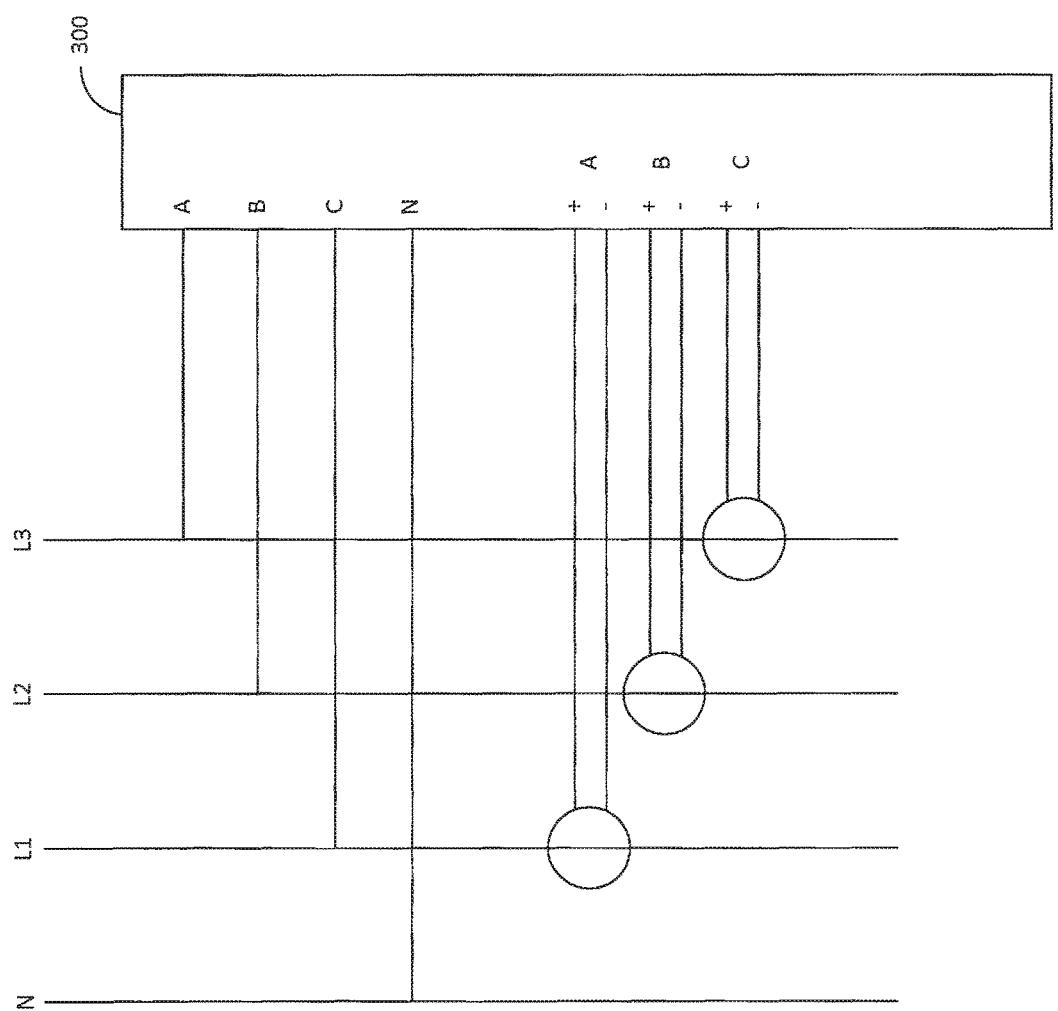
FIG. 10 illustrates one manner of wiring a power meter for sensing voltage and current.

Referring to FIG. 10, an exemplary wiring diagram for a 3-phase 3-wire current transformer with a neural is illustrated. By way of example, the power meter may determine one or more of the following electrical parameters for one or more phases of the input, such as real energy, total instantaneous real power, total instantaneous reactive power, total instantaneous apparent power, total power factor, voltage L-L, voltage average, voltage L-N, current, real power, power factor, voltage phases A-B/B-C/A-C/A-N/B-N/C-N, instantaneous current, frequency, apparent energy consumption, reactive energy consumption, apparent power, reactive power, total real power, total reactive power, total apparent power, etc.

In some embodiments, the power meter may be electrically connected in series with the loads, if desired. As illustrated in FIG. 1 through FIG. 10, the power meter may be in many different configurations and form factors. All or portions of the power meter is preferably housed in a housing. Whether housed in a housing or not housed in a housing, all or portions of the power meter preferably include one or more connectors suitable to detachably connect a separate power meter to sense electrical properties of the power meter, such as the voltage and/or current so that the additional power meter may determine power measurements.

Instantaneous values of the sinusoidal analog voltage and current waveforms are digitally captured by periodically sampling the amplitudes of the outputs of respective voltage and current transducers. The data processing unit calculates the current in the power cable monitored by a current transducer from the characteristics of the transducer and a plurality of sample outputs of the transducer accumulated over a period of time. The "effective," "real" or "active" power is approximated by averaging the sum of the products of temporally corresponding instantaneous samples of the voltage and current for each of the plurality of sampling intervals, such as, at least one cycle of the sinusoidal waveform.

Users of branch circuit monitors are often interested in a number of parameters related to electricity distribution in addition to the voltage, current and effective power for the facility and each of its branch circuits. For example, the reactive power, the portion of the total power that is temporarily stored in the form of electric and magnetic fields due to inductive and capacitive elements in a circuit, influences the voltage levels in a transmission network and are controlled along with the voltage to allow an electrical power system to be operated within acceptable limits. The power factor of an alternating current (AC) circuit is the ratio of real power, the capacity of a circuit to do work, flowing to the load and the apparent power, the product of the voltage and current in the circuit. Non-linear loads such as rectifiers; are discharge devices, such as fluorescent lighting or electric welders, and switched-mode power supplies reduce the power factor and increase the number volt-amperes that must be supplied for a given amount of work. Many users desire that the data processing unit of the branch circuit monitor compute a number of these electrical parameters in addition to determining the voltage, current and effective power and transmit this information to other networked data processing devices utilizing the MODBUS® communication protocol.

The MODBUS communication protocol was developed and published in 1979 for use with Modicon® programmable logic controllers (PLCs). MODBUS is an open serial communication protocol and has become a standard communication protocol for connecting industrial electronic devices. The MODBUS protocol is commonly used to transmit signals from control devices and instrumentation, such as a branch circuit monitor, to a main controller and/or a data aggregating system. The device requesting information or writing information is called the MODBUS master and the devices supplying or reading the information are known as MODBUS slaves. In a standard MODBUS network there is at least one master and up to 247 slaves, each with a unique address. Masters can broadcast a message, known as a query, to all slaves or it can address a query to an individual slave. When the master requests or writes data to a slave, the first byte of the message is the address of the intended slave. A slave only responds to queries containing its address and does not respond to queries directed to other addressees or to broadcast queries.

Figure 11A:

In a MODBUS slave device, information is stored in four tables, each having 9999 entries. Two tables, one a read-only table and one a write only table, store discrete on/off values, referred to as "coils." Similarly, a read-only table and a write-only table store numerical values in data spaces known as "registers." Referring to FIGS. 11A and 11B, a MODBUS point map 500 for a standard MODBUS slave device lists the register numbers 502 and a description 504 of the data stored in the respective registers. In addition, the point map may list the data type and the source of the data, in the case of a branch circuit monitor, the channel or meter number corresponding to a particular circuit monitored by the meter.

Some MODBUS devices can utilize extended register addressing to increase the addressable memory of the device. The output registers of a standard MODBUS device have addresses ranging from 0000 to 270E (hexadecimal), but up to 65,500 registers can be addressed by extending register addressing with addresses from 207F to FFFF. However, all devices in a MODBUS network must utilize the same register addressing and many software drivers for MODBUS master computers and many slave devices do not support extended register addressing. Many MODBUS devices use a MODBUS point map which lists the address assigned to each data point. For example, registers are read with the most significant byte (MSB) first with 32 bit floating point values encoded per IEEE Standard 754. For floating point format variables, each data point appears twice because two 16-bit addresses are used to hold a 32 bit float value. The 16 bit most significant word (MSW) may be in the lower address of the register pair, while the list significant word (LSW) may be in the upper address. It is to be understood that other protocols and techniques other than MODBUS may be used, if desired. For example, N2 and LonWorks may be used.

For a particular power meter, there are numerous registers that are programmed by the power meter, and thus require selection of which registers to use together with what parameter values to store in those registers, and computational resources to regularly compute and update the values for such registers. For example, a power meter may compute (1) the energy consumption least significant word and most significant word; (2) the real power consumed; (3) the reactive power consumed; (4) the apparent power; (5) the power factor; (6) the voltage line to line; (7) voltage line to neutral; (8) the current; (9) real power on phase A; (10) real power on phase B; (11) real power on phase C; (12) power factor on phase A; (13) power factor on phase B; (14) power factor on phase C; (15) voltage phase A-B; (16) voltage phase B-C; (17) voltage phase A-C; (18) voltage phase A-N; (19) voltage phase B-N; (20) voltage phase C-N; (21) current phase A; (22) current phase B; (23) current phase C; (24) average real power; (25) minimum real power; (26) maximum real power; (27) energy consumption for the least and most significant word; (28) real power for the least and most significant word; (29) the reactive power consumed for the least and most significant word; (30) the apparent power for the least and most significant word; (31) the power factor for the least and most significant word; (32) the voltage line to line for the least and most significant word; (33) voltage line to neutral for the least and most significant word; (34) the current for the least and most significant word; (35) real power on phase A for the least and most significant word; (36) real power on phase B for the least and most significant word; (37) real power on phase C for the least and most significant word; (38) power factor on phase A for the least and most significant word; (39) power factor on phase B for the least and most significant word; (40) power factor on phase C for the least and most significant word; (41) voltage phase A-B for the least and most significant word; (42) voltage phase B-C for the least and most significant word; (43) voltage phase A-C for the least and most significant word; (44) voltage phase A-N for the least and most significant word; (45) voltage phase B-N for the least and most significant word; (46) voltage phase C-N for the least and most significant word; (47) current phase A for the least and most significant word; (48) current phase B for the least and most significant word; (49) current phase C for the least and most significant word; (50) average real power for the least and most significant word; (51) minimum real power for the least and most significant word; and (52) maximum real power for the least and most significant word. In many cases, a single command may be used to read all of the data available from the power meter. Other electrical parameters may likewise be determined. Also, parameters may be determined for single and dual phase circuits. The selection of the registers and the values therein becomes even more complicated when there are many three phase power circuits interconnected within the same power meter using the same MODBUS set of registers. Further, the selection of registers becomes even more complicated and computationally demanding when there are one or more single phase power circuits, one or more two phase power circuits, and/or one or more three phase power circuits within the same panel or configuration using the MODBUS registers of the single slave device. The programming of the power meter for this multitude of potential configurations is a time consuming task. Furthermore, the likelihood that particular current transformers are improperly interconnected with different phases or to the wrong load is highly likely, making it difficult to trouble shoot the system to determine the actual configuration, so that accurate data may be obtained.

Accordingly, there are a number of potentially different configurations of the power monitor and as a result there are a number of different configurations of the registers therein. Furthermore, with a plurality of different types of power meters, each of which may have a different configuration of the registers, the selection of the appropriate registers is problematic. For example, register A may be the three phase power for a first type of power meter, but register A may be a single phase power for a second type of power meter. Without discrimination between the different power meters there is a strong likelihood that the inappropriate data will be obtained.

Referring to FIG. 12A to FIG. 12E another Modbus Point Map suitable for a three phase power meter is illustrated. As illustrated, the point map includes three phase summary information, per phase information, accumulated energy information, per phase power information, demand information, usage time information, total harmonic distortion information, configuration information, floating point information regarding the same, firmware related information, etc. As it may be observed, there are a significant number of registers that may be configured by the user and the mapping thereof is known to the controller obtaining the data therefrom.

Referring to FIG. 13A to FIG. 13B another Modbus Point Map suitable for a three phase power meter is illustrated. As illustrated, the point map includes energy consumption information, real power information, reactive power information, apparent power information, power factor information, voltage line to line information, voltage line to neutral information, current information, per phase factors information, average real power information, minimum real power information, maximum real power information, etc., for both integer based values and floating point values. The configuration of the modbus registers of FIG. 13A to FIG. 13B are generally less complex than those illustrated in FIG. 12A to FIG. 12E. As it may be observed, there are a significant number of registers that may be configured by the user and the mapping thereof is known to the controller obtaining the data therefrom.

Referring to FIG. 14A to FIG. 14C another Modbus Point Map suitable for a three phase power meter is illustrated. As illustrated, the point map includes energy consumption information, real power information, reactive power information, apparent power information, power factor information, voltage line to line information, voltage line to neutral information, current information, frequency information, current neutral information, per phase factors information, average real power information, minimum real power information, maximum real power information, current transformer scale information, alarm threshold information, phase loss threshold information, meter alarm status information, meter name information, board name information, firmware revision information, serial number information, error register information, over voltage information, under voltage set counter information, phase loss information over current information, over power set information, Modbus address information, baud rate information, meter enable register information, critical alarm register information, etc. The configuration of the modbus registers of FIG. 14A to FIG. 14C are generally rather complex. As it may be observed, there are a significant number of registers that may be configured by the user and the mapping thereof is known to the controller obtaining the data therefrom.

It is to be understood that single phase and two phase Modbus Point Maps may be, for example, a subset of those illustrated.

The branch current power meter may include a plurality of Modbus configuration data sets, such as configuration 0, configuration 1, configuration 2, and configuration 3 all of which are simultaneously pre-stored on the branch circuit power meter. There may be separate sets of configuration data, suitable for single phase, two phase, and three phase circuits. In addition, a default configuration data set maybe stored in the power meter for each circuit, generally referred to as configuration 0 for each of single phase, two phase, and three phase. By way of example, the user may identify 48 different three phase circuits of the single branch current power meter. For each identified circuit of the single branch current power meter the default configuration 0 may be selected, so that each circuit has a data set where each of the data sets is preferably offset in its register values that that they are non-overlapping.

Through an interface on the branch current power meter or a selection that may be programmatically determined or a value written to a register, the user may select one of the configurations that they want the power meter to use for a particular circuit (e.g., load) that has a selected number of phases. If the particular circuit is a three phase circuit, then configuration data sets suitable for three phase circuits are provided. If the particular circuit is a two phase circuit, then configuration data sets suitable for two phase circuits are provided. If the particular circuit is a single phase circuit, then configuration data sets suitable for a single phase circuit is provided. Based upon the selected Modbus configuration data set, for the particular number of phases of the circuit, the power meter may replace the current Modbus configuration data set with the selected Modbus configuration data set for the selected circuit. Further, upon selection of the desired replacement Modbus configuration data set, the power meter modifies its determination of the appropriate parameters to match that of the replacement Modbus configuration data set. By way of example, if a particular manufacturer has 4 different power meters each of which has a different default Modbus configuration data set, then by including the other three Modbus configuration data sets the registers of the Modbus may be modified to operate in a manner consistent with that of the other one of the 3 different power meters of the particular manufacturer. For those registers that are not suitable for a particular power meter, such as determining the frequency if the particular power meter cannot determine the frequency, the power meter may still load the selected Modbus configuration data while leaving the register associated with that which the power meter cannot determine undefined (or zero).

While a three phase power meter may include a significant variety of Modbus register configurations, when the Modbus register configurations are extended to a significant number of circuits, such as 24-48 different circuits the Modbus register configuration becomes increasingly complicated. An example of such a significant number of Modbus registers would be suitable for the power meter illustrated in FIG. 4. For example, each one phase, two phase, and/or three phase circuits may include a large set of Modbus registers. In addition, Modbus registers related to combinations of the one phase, two phase, and/or three phase circuits add an even more complicated set of Modbus registers. As it may be observed, there are a significant number of registers that may be configured by the user and the mapping thereof is known to the controller obtaining the data therefrom.

Figure 15:
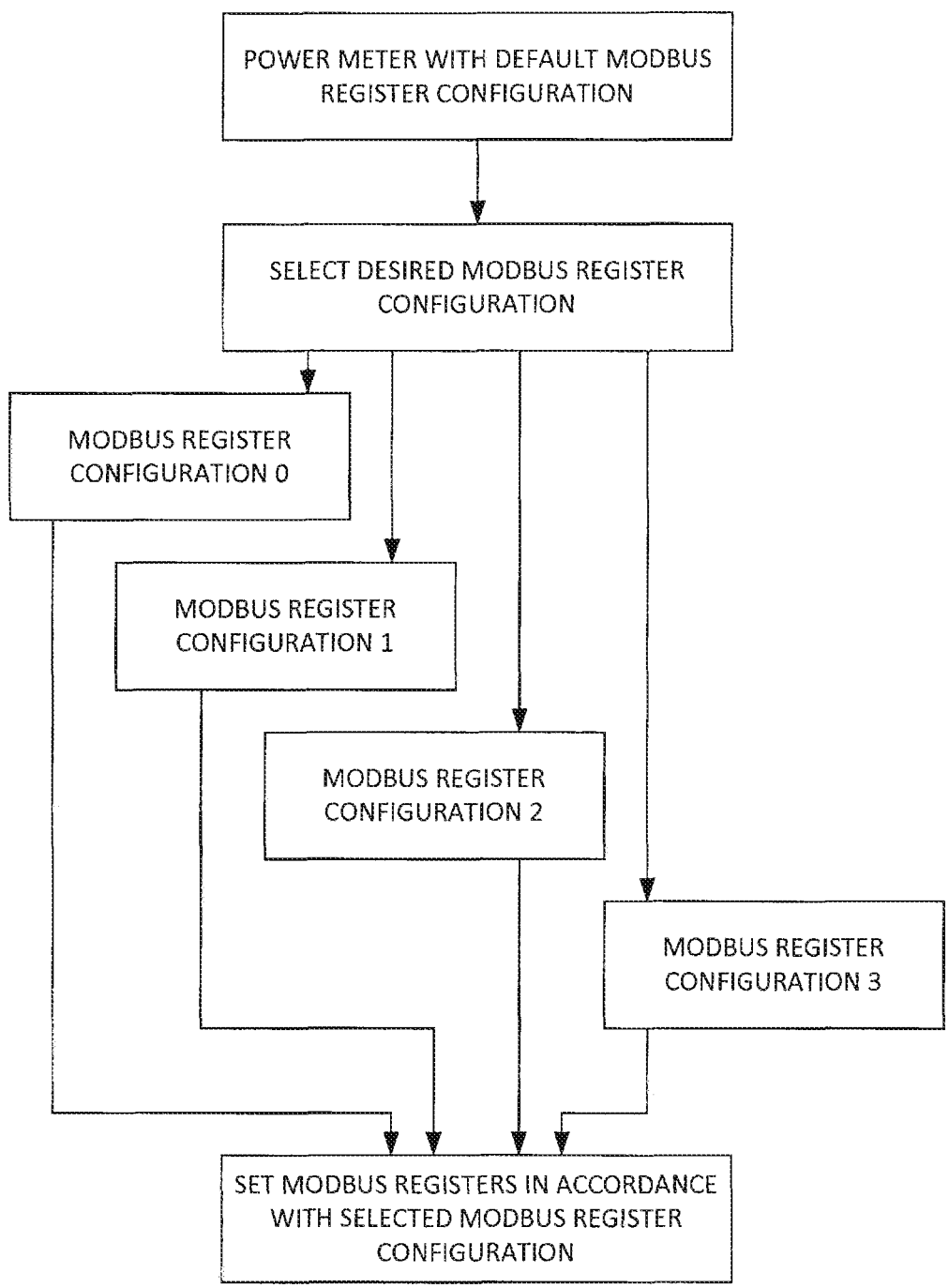
FIG. 15 illustrates a system for the selection of Modbus registers among a set of configuration data sets.

Referring to FIG. 15, the power meter typically comes with a preconfigured default Modbus register configuration. The power meter may include other Modbus configuration data sets, such as configuration 0, configuration 1, configuration 2, and configuration 3 all of which are simultaneously pre-stored on the power meter. Additional or fewer sets of Modbus configuration data sets may be included, as desired. In addition, the default configuration data set is stored in the power meter, generally referred to as configuration 0. Though an interface on the power meter, the user may select one of the configurations that they want the power meter to use. Based upon the selected Modbus configuration data set, the power meter may replace the current Modbus configuration data set with the selected Modbus configuration data set. Further, upon selection of the desired replacement Modbus configuration data set, the power meter modifies its determination of the appropriate parameters to match that of the replacement Modbus configuration data set. By way of example, if a particular manufacturer has 4 different power meters each of which has a different default Modbus configuration data set, then by including the other three Modbus configuration data sets the registers of the Modbus may be modified to operate in a manner consistent with that of the other one of the 3 different power meters of the particular manufacturer.

Figure 16A:
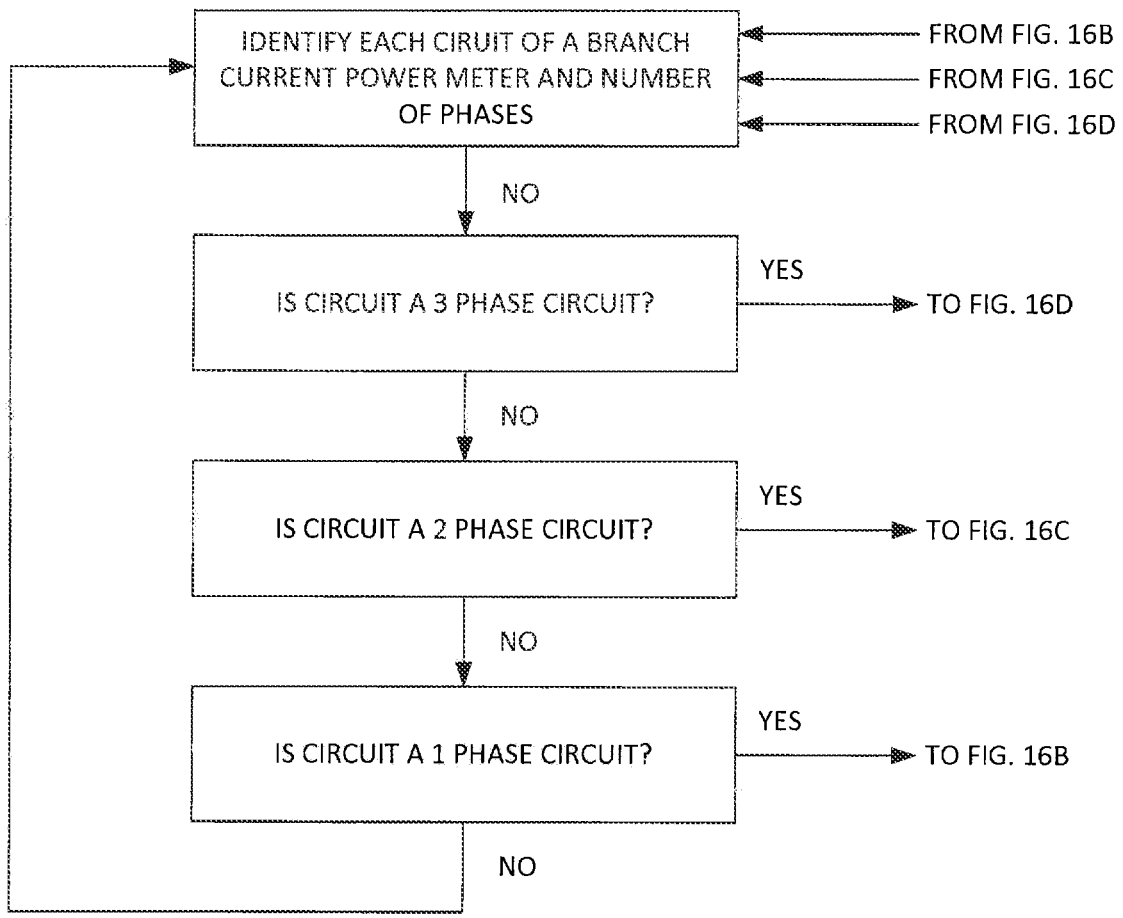
FIG. 16A-D illustrate a system for the selection of Modbus registers among a set of configuration data sets for selected circuits of a branch current power meter.
Figure 16B:
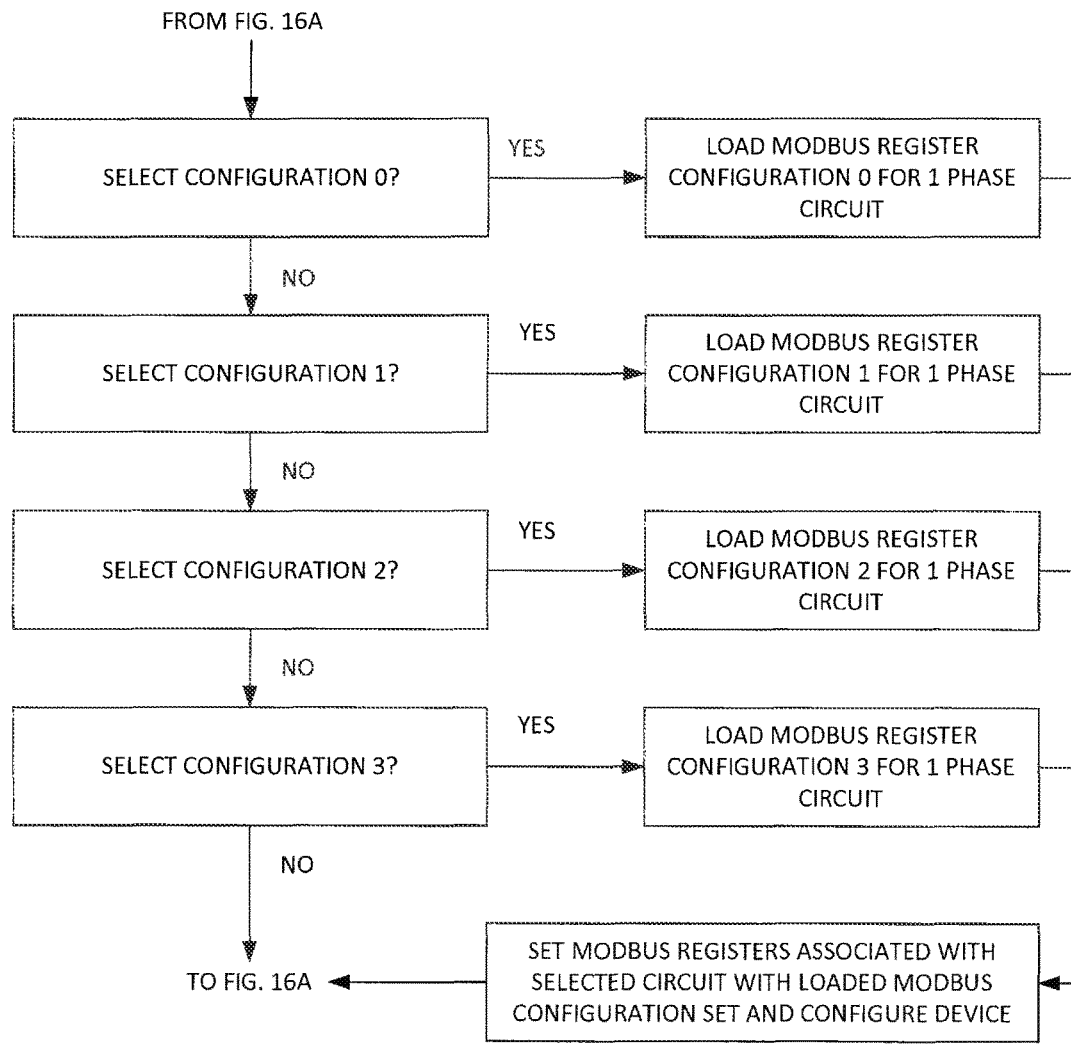
Figure 16C:
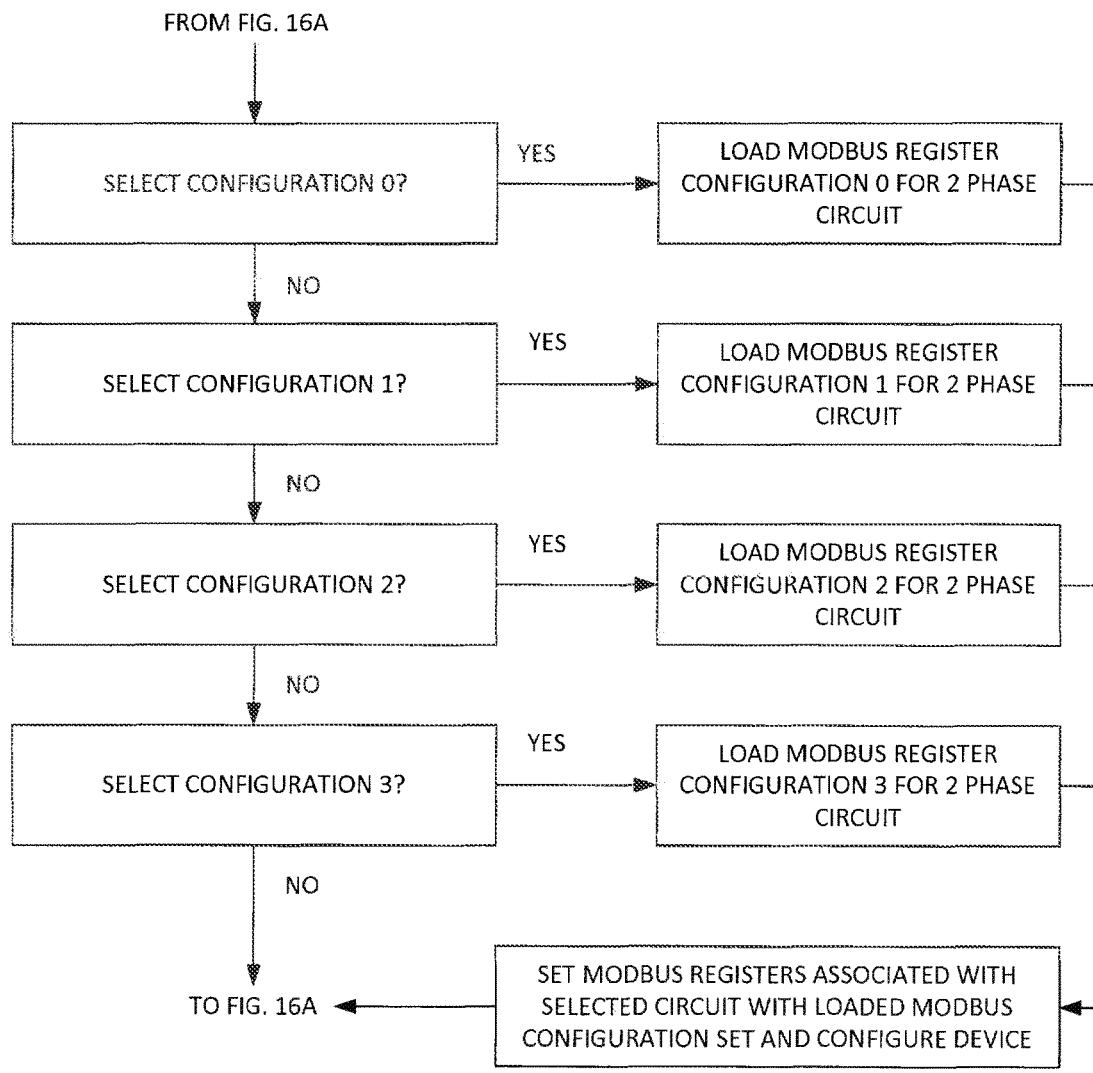
Figure 16D:
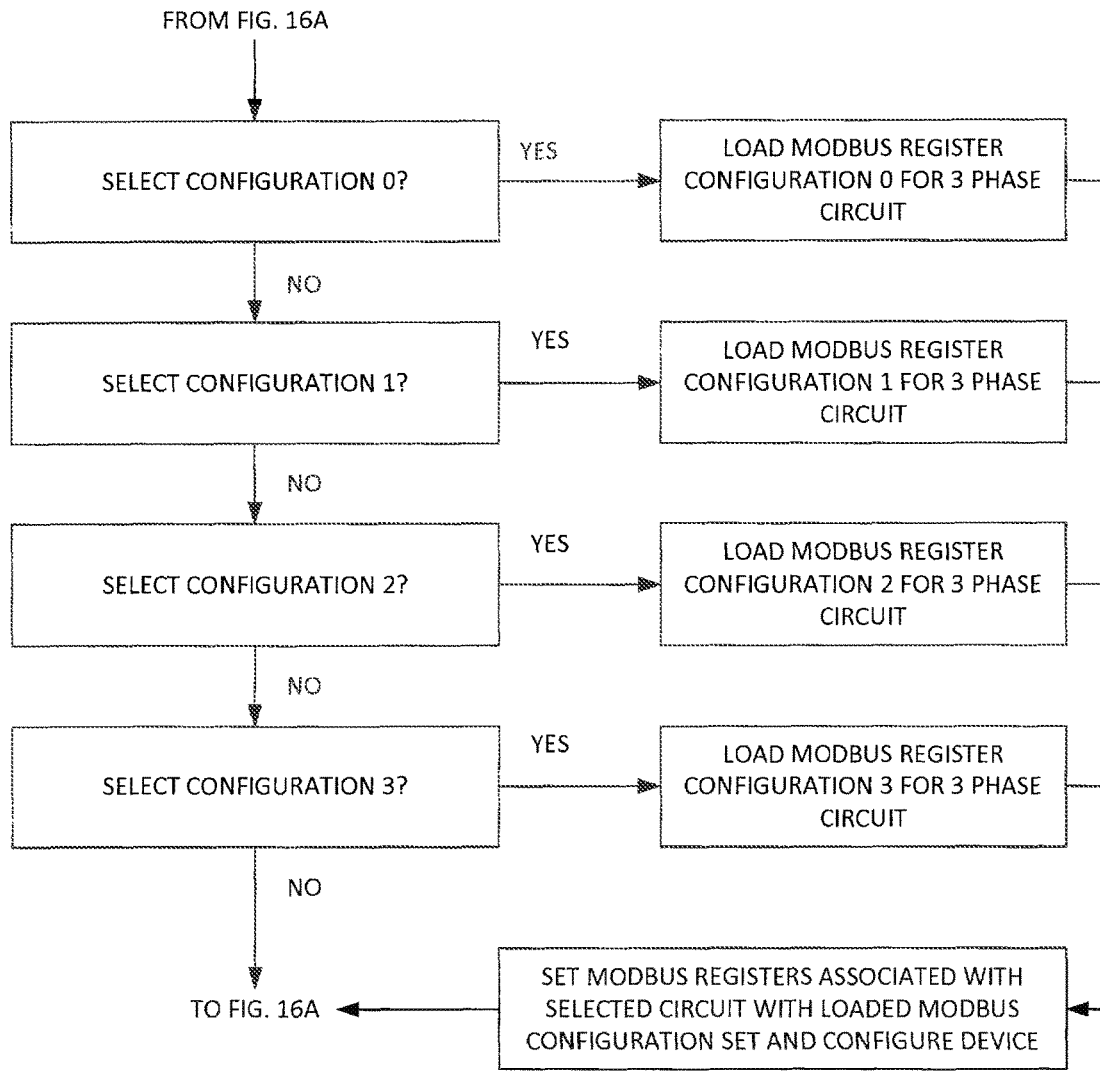

While the configuration of a three phase power meter having three conductors is relatively complex, it is considerably more complicated to configuration a branch current power meter that has a large set of separate loads. Referring to FIG. 16A, to configure a branch current power meter it is desirable to identify each of the different circuits (e.g., loads, whether they be single phase, two phases, or three phases). If the identified circuit is a three phase circuit then a selection process is illustrated in FIG. 16D. If the identified circuit is a two phase circuit then a selection process is illustrated in FIG. 16C. If the identified circuit is a single phase circuit then a selection process is illustrated in FIG. 16B. The process of identify circuits is preferably repeated until all of the desired circuits are identified.

Referring to FIG. 16B, the device may determine if the user selected configuration 0. If the user has selected configuration 0, the device may load the Modbus register configuration 0 for a 1 phase circuit. If the user did not select configuration 0, the device may determine if the user selected configuration 1. If the user has selected configuration 1, the device may load the Modbus register configuration 1 for a 1 phase circuit. If the user did not select configuration 1, the device may determine if the user selected configuration 2. If the user has selected configuration 2, the device may load the Modbus register configuration 2 for a 1 phase circuit. If the user did not select configuration 2, the device may determine if the user selected configuration 3. If the user has selected configuration 3, the device may load the Modbus register configuration 3 for a 1 phase circuit. If the user did not select any of configuration 0, 1, 2, or 3 then the user then identifies a branch circuit (see FIG. 16A). The selected and loaded Modbus register configuration is then used to set the Modbus registers associated with the selected circuit and configure the device. After the selection and configuration the user then identifies a branch circuit (see FIG. 16A).

Referring to FIG. 16C, the device may determine if the user selected configuration 0. If the user has selected configuration 0, the device may load the Modbus register configuration 0 for a 2 phase circuit. If the user did not select configuration 0, the device may determine if the user selected configuration 1. If the user has selected configuration 1, the device may load the Modbus register configuration 1 for a 2 phase circuit. If the user did not select configuration 1, the device may determine if the user selected configuration 2. If the user has selected configuration 2, the device may load the Modbus register configuration 2 for a 2 phase circuit. If the user did not select configuration 2, the device may determine if the user selected configuration 3. If the user has selected configuration 3, the device may load the Modbus register configuration 3 for a 2 phase circuit. If the user did not select any of configuration 0, 1, 2, or 3 then the user then identifies a branch circuit (see FIG. 16A). The selected and loaded Modbus register configuration is then used to set the Modbus registers associated with the selected circuit and configure the device. After the selection and configuration the user then identifies a branch circuit (see FIG. 16A).

Referring to FIG. 16D, the device may determine if the user selected configuration 0. If the user has selected configuration 0, the device may load the Modbus register configuration 0 for a 3 phase circuit. If the user did not select configuration 0, the device may determine if the user selected configuration 1. If the user has selected configuration 1, the device may load the Modbus register configuration 1 for a 3 phase circuit. If the user did not select configuration 1, the device may determine if the user selected configuration 2. If the user has selected configuration 2, the device may load the Modbus register configuration 2 for a 3 phase circuit. If the user did not select configuration 2, the device may determine if the user selected configuration 3. If the user has selected configuration 3, the device may load the Modbus register configuration 3 for a 3 phase circuit. If the user did not select any of configuration 0, 1, 2, or 3 then the user then identifies a branch circuit (see FIG. 16A). The selected and loaded Modbus register configuration is then used to set the Modbus registers associated with the selected circuit and configure the device. After the selection and configuration the user then identifies a branch circuit (see FIG. 16A).

If desired, the device could include a different Modbus address for one or more of the circuits that are identified. For example, if a different Modbus address is used for each circuit then the selected and configured Modbus registers for each circuit may be at the same overlapping register ranges. In this manner, the configuration of the branch current power metering device is simplified.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:
1. A method for configuring a power meter including registers comprising the steps of:
 (a) receiving by said power meter a plurality of current input signals representative of a current level in a respective conductor;

(b) receiving by said power meter a plurality of voltage input signals representative of a voltage level in a respective said conductor;

(c) configuring said power meter including a set of registers where said set of registers is configured with an initial configuration, where said power meter is configured to determine based upon said initial configuration a first value to include in a first of said set of registers based upon a combination of at least one of said plurality of current input signals and at least one of said plurality of voltage input signals, where said power meter is configured to determine based upon said initial configuration a second value to include in a second of said set of registers based upon a combination of at least one of said plurality of current input signals and at least one of said plurality of voltage input signals, (d) providing said power meter together with said initial configuration a first data set for a first configuration of said set of registers of said power meter where said first configuration is configured only when selected to determine based upon said first configuration a third value to include in one of said set of registers based upon a combination of at least one of said plurality of current input signals and at least one of said plurality of voltage input signals where said first data set is stored within said power meter at a location separate from said set of registers, a second data set for a second configuration of said set of registers of said power meter where said second configuration only when selected is configured to determine based upon said first configuration a fourth value to include in one of said set of registers based upon a combination of at least one of said plurality of current input signals and at least one of said plurality of voltage input signals where said second data set is stored within said power meter at a location separate from said set of registers, a third data set for a third configuration of said set of registers of said power meter where said third configuration is configured only when selected to determine based upon said first configuration a fifth value to include in one of said set of registers based upon a combination of at least one of said plurality of current input signals and at least one of said plurality of voltage input signals where said third data set is stored within said power meter at a location separate from said set of registers, wherein said first data set, said second data set, and said third data set are separate from one another, wherein said first data set, said second data set, and said third data set are non-overlapping with one another;

(e) said power meter selecting with a selector a first selected data set that includes only one of a first one of said first data set, said second data set, and said third data set for a first load associated with at least one of said conductors for a first set of said set of registers, where said first selected data set configures said first set of said set of registers and overwrites at least a first portion of said initial configuration in such a manner that said first portion of said initial configuration is no longer present within said power meter separate from said registers, wherein the output of said first set of said set of registers based upon said initial configuration is different than the output of said first set of registers based upon said first selected data set;

(f) said power meter selecting with said selector a second selected data set that includes only one of a second one of said first data set, said second data set, and said third data set that is different than said first selected data set for a second load associated with at least one of said conductors for a second set of said set of registers, where said first set of registers is different than said second set of registers, where said second selected data set configures said second set of said set of registers and overwrites at least a second portion of said initial configuration in such a manner that said second portion of said initial configuration is no longer present within said power meter separate from said registers, where said first portion and said second portion are different from one another, wherein the output of said second set of said set of registers based upon said initial configuration is different than the output of said second set of registers based upon said second selected data set;

(g) wherein said first data set is a configuration suitable for a single phase circuit, said second data set is a configuration suitable for a two phase circuit, said second data set is a configuration suitable for a three phase circuit, and said first selected data set and said second selected data set are suitable for different ones of said single phase circuit, said two phase circuit, and said three phase circuit;

(h) providing by said power meter data from said set of registers in accordance with said first portion and said second portion.

2. The power meter of claim 1 wherein said selector said selects a first one of said first data set, said second data set, and said third data set for said first load associated with at least one of said conductors for said first set of said set of registers.

3. The power meter of claim 2 wherein said selector said selects a second different one of said first data set, said second data set, and said third data set for said second load associated with at least one of said conductors for said second set of said set of registers.

4. The power meter of claim 3 wherein said selector said selects a third different one of said first data set, said second data set, and said third data set for a third load associated with at least one of said conductors for a third set of said set of registers, where said third set is different than either of said first set and said second set.

5. The power meter of claim 4 wherein said first load is a three phase load.

6. The power meter of claim 5 wherein said second load is a single phase load.

7. The power meter of claim 6 wherein said third load is a two phase load.

\* \* \* \* \*